United States Patent
Son et al.

(10) Patent No.: US 9,337,351 B2
(45) Date of Patent: *May 10, 2016

(54) THREE-DIMENSIONAL NONVOLATILE MEMORY DEVICES INCLUDING INTERPOSED FLOATING GATES

(71) Applicant: Samsung Electronics Co., Ltd., Suwon-si (KR)

(72) Inventors: Byoungkeun Son, Suwon-si (KR); Hansoo Kim, Seoul (KR); Jinho Kim, Hwasung-si (KR); Kihyun Kim, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/619,921

(22) Filed: Feb. 11, 2015

(65) Prior Publication Data
US 2015/0155292 A1 Jun. 4, 2015

Related U.S. Application Data

(63) Continuation of application No. 14/614,908, filed on Feb. 5, 2015, which is a continuation of application No. 14/164,408, filed on Jan. 27, 2014, which is a continuation of application No. 13/684,645, filed on Nov. 26, 2012, now Pat. No. 8,674,414, which is a continuation of application No. 12/720,021, filed on Mar. 9, 2010, now Pat. No. 8,338,244.

(30) Foreign Application Priority Data

Mar. 19, 2009 (KR) .................. 10-2009-0023626

(51) Int. Cl.
*H01L 29/788* (2006.01)
*H01L 29/66* (2006.01)
(Continued)

(52) U.S. Cl.
CPC ........ *H01L 29/788* (2013.01); *H01L 27/11551* (2013.01); *H01L 27/11556* (2013.01);
(Continued)

(58) Field of Classification Search
CPC .................. H01L 27/11519; H01L 27/11551; H01L 27/11556; H01L 27/11582; H01L 29/42324; H01L 29/66666; H01L 29/66825; H01L 29/7827; H01L 29/7841; H01L 29/788; H01L 29/7889; H01L 27/115; H01L 27/11521
USPC ........... 257/321, 319, 331, 315, 320; 438/149
See application file for complete search history.

(56) References Cited

U.S. PATENT DOCUMENTS

| | | | |
|---|---|---|---|
| 5,153,813 A | 10/1992 | Oehrlein et al. | |
| 5,897,354 A | 4/1999 | Kachelmeier | |

(Continued)

FOREIGN PATENT DOCUMENTS

| | | | |
|---|---|---|---|
| JP | 6-338602 A | 12/1994 | |
| JP | 2008-159699 A | 7/2008 | |

(Continued)

OTHER PUBLICATIONS

Endoh et al., "Novel Ultra High Density Memory With a Stacked-Surrounding Gate Transistor (S-SGT) Structured Cell," IEDM Proc. (2001) 33-36.

(Continued)

*Primary Examiner* — Mohammed Shamsuzzaman
(74) *Attorney, Agent, or Firm* — Myers Bigel & Sibley, P.A.

(57) ABSTRACT

Provided are three-dimensional nonvolatile memory devices and methods of fabricating the same. The memory devices include semiconductor pillars penetrating interlayer insulating layers and conductive layers alternately stacked on a substrate and electrically connected to the substrate and floating gates selectively interposed between the semiconductor pillars and the conductive layers. The floating gates are formed in recesses in the conductive layers.

19 Claims, 29 Drawing Sheets

(51) Int. Cl.
*H01L 29/423* (2006.01)
*H01L 29/78* (2006.01)
*H01L 27/115* (2006.01)

(52) U.S. Cl.
CPC .... *H01L27/11582* (2013.01); *H01L 29/42324* (2013.01); *H01L 29/66666* (2013.01); *H01L 29/66825* (2013.01); *H01L 29/7827* (2013.01); *H01L 29/7841* (2013.01); *H01L 29/7883* (2013.01); *H01L 29/7889* (2013.01); *H01L 27/11519* (2013.01)

(56) References Cited

U.S. PATENT DOCUMENTS

| | | |
|---|---|---|
| 6,238,978 B1 | 5/2001 | Huster |
| 6,624,018 B1 | 9/2003 | Yu et al. |
| 6,953,697 B1 | 10/2005 | Castle et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,298,006 B2 * | 11/2007 | Arai ................... G11C 16/0483 257/316 |
| 7,476,614 B2 | 1/2009 | Kwak et al. |
| 7,514,321 B2 | 4/2009 | Mokhlesi et al. |
| 7,575,973 B2 | 8/2009 | Mokhlesi et al. |
| 7,679,133 B2 | 3/2010 | Son et al. |
| 7,745,265 B2 | 6/2010 | Mokhlesi et al. |
| 7,746,680 B2 | 6/2010 | Scheuerlein et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 7,994,011 B2 | 8/2011 | Park et al. |
| 8,008,710 B2 | 8/2011 | Fukuzumi |
| 8,053,829 B2 | 11/2011 | Kang et al. |
| 8,063,438 B2 | 11/2011 | Son et al. |
| 8,236,650 B2 | 8/2012 | Son et al. |
| 8,329,537 B2 | 12/2012 | Kim et al. |
| 8,330,208 B2 | 12/2012 | Alsmeier et al. |
| 8,338,244 B2 | 12/2012 | Son et al. |
| 8,338,876 B2 * | 12/2012 | Kito ................... H01L 27/11551 257/296 |
| 8,383,482 B2 | 2/2013 | Kim et al. |
| 8,427,881 B2 | 4/2013 | Jang et al. |
| 8,429,828 B2 | 4/2013 | Ferrari |
| 8,450,176 B2 | 5/2013 | Son et al. |
| 8,592,873 B2 | 11/2013 | Kim et al. |
| 8,595,601 B2 | 11/2013 | Kim et al. |
| 8,610,194 B2 * | 12/2013 | Aritome ........................ 257/315 |
| 8,625,348 B2 | 1/2014 | Lee et al. |
| 8,674,414 B2 | 3/2014 | Son et al. |
| 2002/0028541 A1 * | 3/2002 | Lee ................... G11C 16/3427 438/149 |
| 2007/0210338 A1 | 9/2007 | Orlowski |
| 2007/0252201 A1 * | 11/2007 | Kito ................... H01L 21/8221 257/331 |
| 2008/0099819 A1 | 5/2008 | Kito et al. |
| 2008/0123390 A1 | 5/2008 | Kim et al. |
| 2008/0173928 A1 | 7/2008 | Arai et al. |
| 2008/0175032 A1 | 7/2008 | Tanaka et al. |
| 2008/0179659 A1 | 7/2008 | Enda et al. |
| 2009/0283819 A1 | 11/2009 | Ishikawa et al. |
| 2009/0294828 A1 | 12/2009 | Ozawa et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0148237 A1 | 6/2010 | Kito et al. |
| 2010/0155810 A1 | 6/2010 | Kim et al. |
| 2010/0155818 A1 | 6/2010 | Cho et al. |
| 2010/0181610 A1 | 7/2010 | Kim et al. |
| 2010/0181612 A1 * | 7/2010 | Kito ................... H01L 27/11551 257/319 |
| 2010/0181613 A1 | 7/2010 | Kim et al. |
| 2010/0207194 A1 | 8/2010 | Tanaka et al. |
| 2010/0207195 A1 | 8/2010 | Fukuzumi et al. |
| 2011/0076819 A1 | 3/2011 | Kim et al. |
| 2011/0133606 A1 | 6/2011 | Yoshida et al. |
| 2011/0284947 A1 | 11/2011 | Kito et al. |
| 2011/0287597 A1 | 11/2011 | Kito et al. |
| 2012/0001249 A1 * | 1/2012 | Alsmeier .......... H01L 27/11551 257/319 |
| 2012/0001252 A1 * | 1/2012 | Alsmeier .......... H01L 27/11551 257/321 |
| 2012/0256247 A1 * | 10/2012 | Alsmeier .............. H01L 21/764 257/319 |
| 2014/0138760 A1 * | 5/2014 | Makala ............ H01L 21/28273 257/321 |
| 2014/0225181 A1 * | 8/2014 | Makala ................ H01L 29/7889 257/321 |
| 2014/0353738 A1 * | 12/2014 | Makala et al. ................ 257/321 |
| 2015/0155292 A1 * | 6/2015 | Son ................... H01L 27/11551 257/321 |
| 2015/0179660 A1 * | 6/2015 | Yada ................. H01L 21/02164 257/321 |
| 2015/0318295 A1 * | 11/2015 | Kai ................... H01L 27/11556 257/319 |

FOREIGN PATENT DOCUMENTS

| | | |
|---|---|---|
| KR | 10-2007-0091833 A | 9/2007 |
| KR | 10-2007-0096972 A | 10/2007 |
| KR | 10-0799055 B1 | 1/2008 |
| KR | 10-2008-0048314 A | 6/2008 |
| WO | WO 02/15277 A2 | 2/2002 |

OTHER PUBLICATIONS

Jang et al. "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-shaped BiCS Flash Memory, " 2009 Symposium on VLSI Technology Digest of Technical Papers, pp. 22-23.

* cited by examiner

THREE-DIMENSIONAL NONVOLATILE MEMORY DEVICES INCLUDING INTERPOSED FLOATING GATES

CROSS-REFERENCE TO RELATED APPLICATIONS

This U.S. application is a continuation of U.S. patent application Ser. No. 14/614,908, filed Feb. 5, 2015, which itself is a continuation of U.S. patent application Ser. No. 14/164,408, filed Jan. 27, 2014, which itself is a continuation of U.S. patent application Ser. No. 13/684,645, filed Nov. 26, 2012, now U.S. Pat. No. 8,674,414, which itself is a continuation of U.S. patent application Ser. No. 12/720,021, filed Mar. 9, 2010, now U.S. Pat. No. 8,338,244, which itself claims priority under 35 U.S.C. §119 to Korean Patent Application 10-2009-0023626, filed on Mar. 19, 2009, the disclosures of which are hereby incorporated herein by reference in their entireties as if set forth fully herein.

BACKGROUND

The present disclosure herein relates to three-dimensional nonvolatile memory devices and methods of fabricating the same.

Microelectronic devices are widely used in many consumer, commercial and other applications. As the integration density of microelectronic devices continues to increase, three-dimensional microelectronic devices may be fabricated, wherein active devices, such as transistors, are stacked on a microelectronic substrate, such as an integrated circuit substrate.

In particular, memory devices are widely used for general storage and transfer of data in computers and other digital products. In some memory devices, a string of memory cells are connected in series. Moreover, in order to increase the integration density of memory devices, three-dimensional or vertical memory devices have been developed, wherein a string of serially connected memory cells is formed by the memory cells vertically being stacked on a face of a substrate, wherein a first memory cell in the string of serially connected memory cells is adjacent the face of the substrate and a last memory cell in the string of serially connected memory cells is remote from the face of the substrate. As used herein, and as conventionally used, the "vertical" direction is generally orthogonal to the face of the substrate, whereas the "horizontal" direction is generally parallel to (extending along) the face of the substrate. By vertically stacking the memory cells to form the string, increased integration density may be provided. These vertically stacked structures may also be referred to as "three-dimensional" memory devices.

SUMMARY

The present disclosure relates to three-dimensional nonvolatile memory devices that can have excellent reliability and methods of fabricating the same by simple processes.

Embodiments of the inventive concept provide methods of fabricating three-dimensional nonvolatile memory devices. These methods include: forming openings penetrating interlayer insulating layers and conductive layers stacked alternately on a substrate; forming expansions having a diameter wider than that of the openings penetrating the interlayer insulating layers by selectively recessing sidewalls of the conductive layers exposed by the openings; forming first insulating layers on surfaces of the conductive layers exposed by the expansions; forming floating gates disposed in the expansions interposing the first insulating layers; forming second insulating layers on surfaces of the floating gates adjacent to the openings; and forming semiconductor pillars filling the openings.

In some embodiments, the forming of the expansions may include: isotropically etching the conductive layers so as to selectively etch the conductive layers more than the substrate and the interlayer insulating layers, and the forming of the floating gates may include: forming buried conductive layers filling the openings and the expansions; and anisotropically etching the buried conductive layers to expose an upper surface of the substrate.

In other embodiments, the forming of the first insulating layers and the second insulating layers may include performing an oxidation process or deposition process.

In still other embodiments, the methods may further include: forming sequentially stacked lower interlayer insulating layers and lower conductive layers including lower openings provided with sidewalls to be connected successively to the openings on the substrate, before forming the openings.

In yet other embodiments, the methods may further include: isolating the interlayer insulating layers and the conductive layers from each other between the semiconductor pillars; and forming silicide layers on surfaces of the isolated conductive layers.

According to other embodiments, three-dimensional nonvolatile memory devices may be fabricated by forming openings penetrating interlayer insulating layers and conductive layers stacked alternately on a substrate. Then, the sidewalls of the conductive layers that are exposed by the openings are recessed relative to the sidewalls of the interlayer insulating layers that are exposed by the openings, to thereby define expansions between portions of adjacent insulating layers that are exposed by the recessing of the sidewalls of the conductive layers. In some embodiments, the expansions are ring-shaped expansions surrounding the openings. Floating gates are then form in the expansions. Semiconductor pillars are then formed in the openings to extend on the floating gates and on the sidewalls of the interlayer insulating layers.

In some embodiments, between the recessing of the sidewalls and the forming of the floating gates, an insulating layer is formed on the sidewalls of the conductive layers. Moreover, between the forming of the floating gates and the forming of the semiconductor pillars, an insulating layer may be formed on the floating gates, adjacent the openings. Two separate insulating layers may also be formed in some embodiments.

In yet other embodiments, the sidewalls are recessed by selectively etching the sidewalls of the conductive layers that are exposed by the openings relative to the sidewalls of the interlayer insulating layers that are exposed by the openings. Moreover, in some embodiments, the floating gates may be formed in the expansions by forming a conductive layer in the openings and in the expansions, and removing the conductive layer from the openings while allowing the conductive layer to remain in the expansions.

In still other embodiments, prior to forming the openings, lower insulating layers and lower conductive layers are sequentially stacked upon one another on the substrate. Lower openings are formed penetrating the lower insulating layers and the lower conductive layers. Moreover, when the openings are formed in the interlayer insulating layers and conductive layers, they are aligned to the lower openings.

In yet other embodiments, a silicide layer is also formed on sidewalls of the floating gates opposite the semiconductor pillars. In some embodiments, prior to forming the silicide layer, a conductive layer may be formed on the sidewalls of the floating gates opposite the semiconductor pillars.

Embodiments of the inventive concept also provide three-dimensional nonvolatile memory devices, including: semiconductor pillars penetrating interlayer insulating layers and conductive layers alternately stacked on a substrate and electrically connected to the substrate; floating gates electrically isolated by the interlayer insulating layers and locally interposed between the semiconductor pillars and the conductive layers; first insulating layers interposed between the floating gates and adjacent sidewalls of the conductive layers; and second insulating layers interposed between the floating gates and the semiconductor pillars.

In some embodiments, the floating gates may be interposed between the interlayer insulating layers adjacent to each other, and the first insulating layers may be disposed between the floating gates and the interlayer insulating layers by extending from the floating gates and the sidewalls of the conductive layers.

In other embodiments, the second insulating layers may surround the semiconductor pillars by vertically extending to sidewalls of the interlayer insulating layers from sidewalls of the floating gates.

In still other embodiments, the conductive layers may include selection line conductive layers, the second insulating layers may be interposed between the selection line conductive layers and the semiconductor pillars, and the selection line conductive layers may come in directly contact with the second insulating layers.

In yet other embodiments, each of the conductive layers may have a multi-layered structure disposed in parallel between adjacent interlayer insulating layers.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION OF PREFERRED EMBODIMENTS

Figure 1:
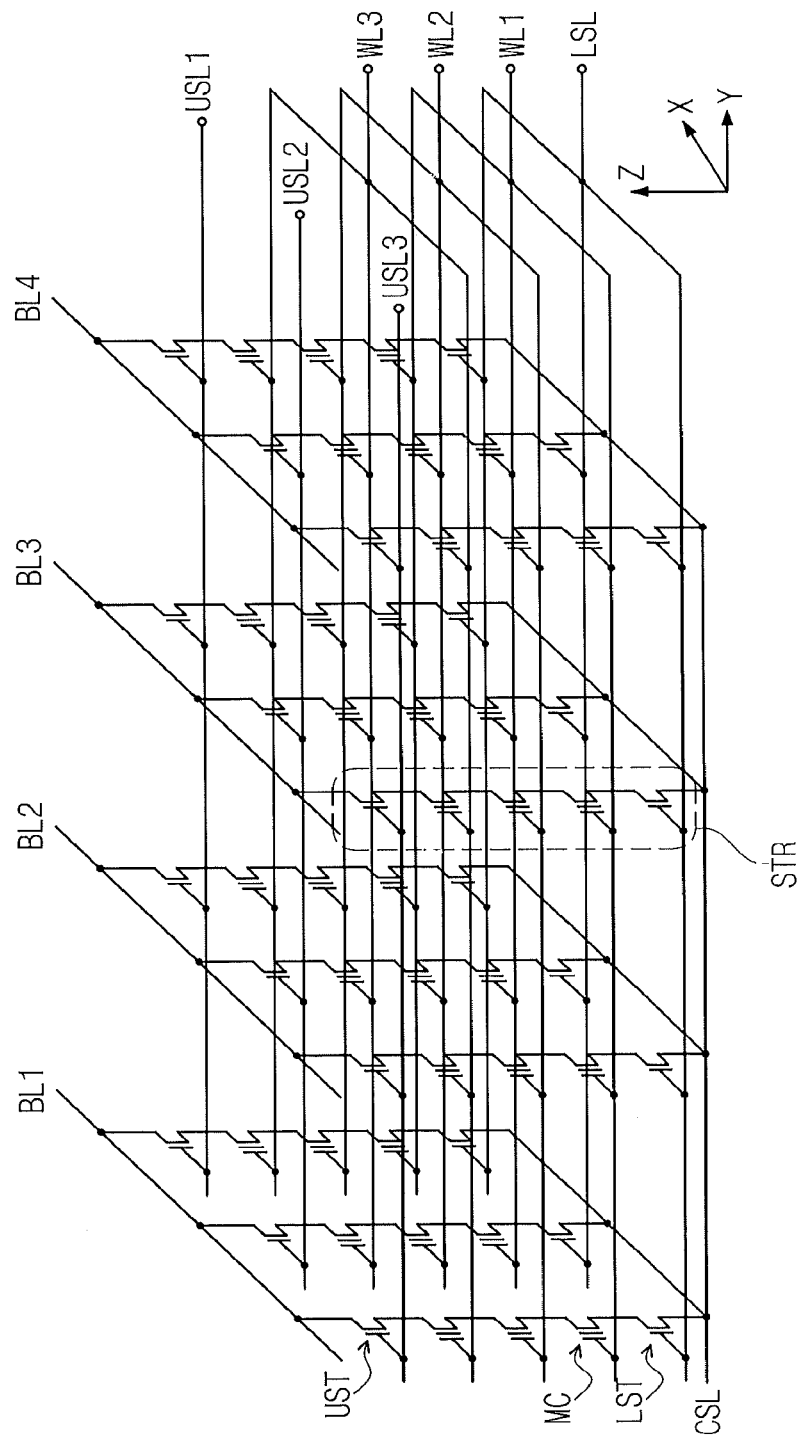
FIG. 1 is a circuit diagram of nonvolatile memory devices according to embodiments of the inventive concept.

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it can be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it can be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below. However, as used herein, and as conventionally used, the "vertical" direction is generally orthogonal to the face of the substrate regardless of its orientation, whereas the "horizontal" direction is generally parallel to (extending along) the face of the substrate.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a circuit diagram illustrating three-dimensional nonvolatile memory devices according to various embodiments of the inventive concept.

Referring to FIG. 1, a nonvolatile memory device according to some embodiments of the inventive concept includes a cell array having a plurality of strings STRs. The cell array includes a plurality of bit lines BL1 to BL4, word lines WL1 to WL3, upper selection lines USL1 to USL3, a lower selection line LSL, and a common source line CSL. In addition, the nonvolatile memory device includes a plurality of strings STRs between the bit lines BL1 to BL4 and the common source line CSL.

Each of the strings STRs includes upper and lower selection transistors UST and LST and a plurality of memory cell transistors MC connected between the upper and lower selection transistors UST and LST in series. A drain of the upper selection transistor UST is connected to the bit lines BL1 and BL4, and a source of the lower selection transistor LST is connected to the common source line CSL. The common source line CSL is a line to which the sources of the lower selection transistors LSTs are connected in common.

Further, the upper selection transistors USTs are connected to the upper selection lines USL1 and USL3, and each of the lower selection transistors LSTs is connected to the lower selection line LSL. In addition, each of memory cells MCs is connected to word lines WL1 to WL3.

Since the above-mentioned cell array is arranged in the three-dimensional structure, the strings STRs have a structure in which the memory cells MCs are connected to each other in series in a Z-axis direction perpendicular to X-Y plane in parallel to the upper surface of a substrate. Accordingly, channels of the selection transistors UST and LST and channels of the memory cell transistors MCs may be formed in a direction perpendicular to X-Y plane.

In the three-dimensional nonvolatile memory device, m memory cells may be formed in each X-Y plane, and X-Y plane having the m memory cells may be stacked with n layers (where, m and n are natural numbers).

Nonvolatile memory devices according to various embodiments of the inventive concept will be described below with reference to FIGS. 2 through 9.

A nonvolatile memory device according to first embodiments of the inventive concept will be described.

Figure 2:
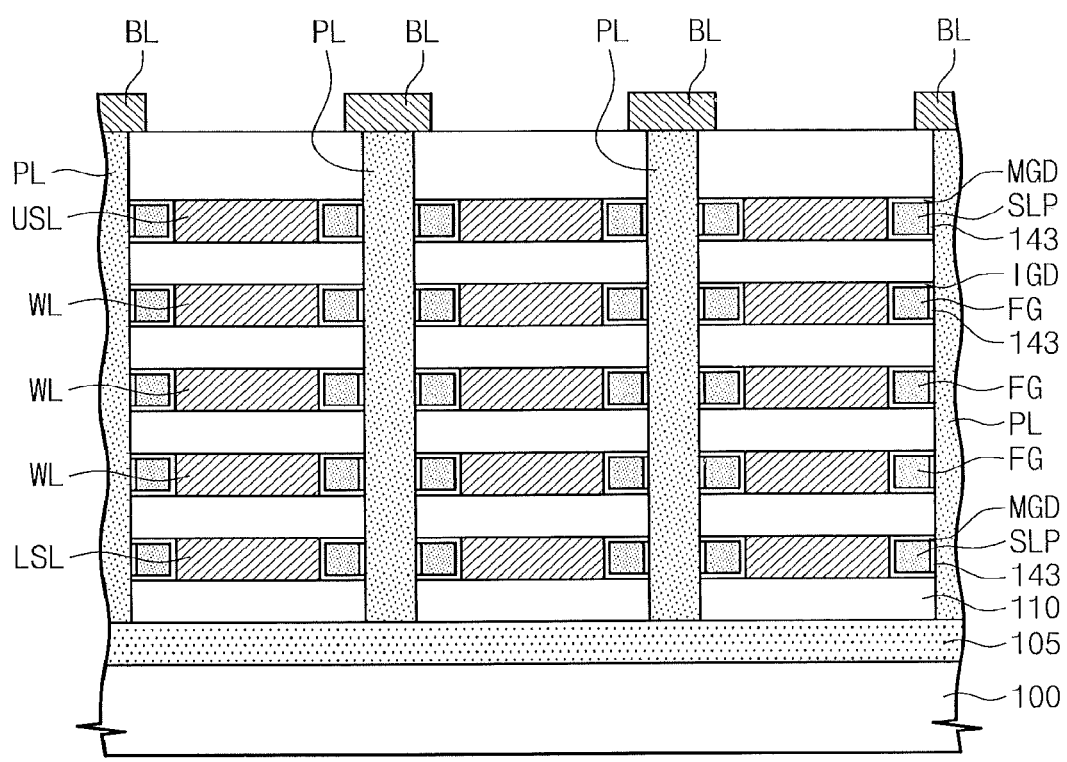
FIGS. 2, 4, 6, and 8 are cross-sectional views of nonvolatile memory devices according to various embodiments of the inventive concept, respectively.
Figure 3:
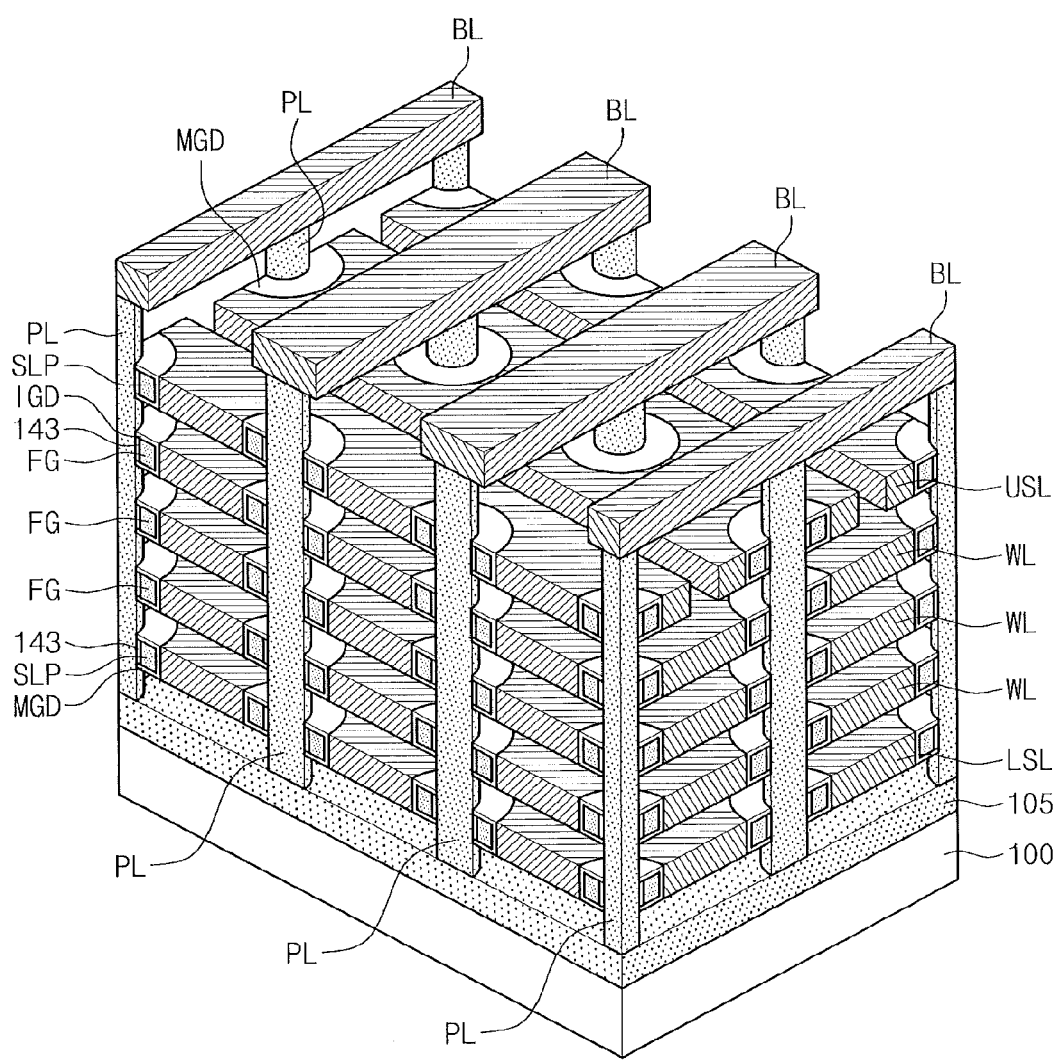
FIGS. 3, 5, 7, and 9 are perspective views of nonvolatile memory devices according to various embodiments of the inventive concept, respectively.

Referring to FIGS. 2 and 3, interlayer insulating layers 110 (see FIG. 2) and conductive layers LSL WL, and USL may alternately be stacked on a substrate 100, repeatedly. The substrate 100 may be a semiconductor substrate including an impurity region 105 (for example, well region) used as a common source line CSL (see FIG. 1). Out of the conductive layers LSL, WL, and USL, the uppermost layer may be used as an upper selection line USL, the lowermost layer may be used as a lower selection line LSL, and remaining conductive layers may be used as word lines WLs. The conductive layers may be made of a conductive poly silicon and/or metal material.

The lower selection line LSL may be formed in a plate shape or a line shape separated from each other. The upper selection line USL may be formed in a line shape separated from each other. The word lines are located between the upper selection line USL and the lower selection line LSL. The word lines may be a plate shape. Since the word lines are formed in the plate shape on each layer, the same voltage may be applied to the word lines of the memory cells formed on the same layer.

In addition, the word lines WLs formed at an upper part may have a relatively small area compared to the word lines WLs formed at a lower part. That is, the stacked structure of the interlayer insulating layers 110 (see FIG. 2) and the conductive layers LSL, WL, and USL may have a staircase-shaped edge.

A plurality of semiconductor pillars PLs may be disposed on the substrate 100. The plurality of semiconductor pillars PLs penetrates the stacked interlayer insulating layers 110 and conductive layers LSL, WL, and USL. The semiconductor pillars PLs may be electrically connected to the impurity region 105 included in the substrate 100. The semiconductor pillars PLs are spaced from one another and may be arranged in the form of a planar matrix. The semiconductor pillars PLs are formed of a semiconductor material. Moreover, the semiconductor pillars PLs may correspond to each string of the nonvolatile memory device. Channels of the selection transistors and memory cell transistors of each string may be electrically connected to each other through the semiconductor pillars PLs. The semiconductor pillars PLs may be a cylindrical shape but are not limited thereto. The semiconductor pillars PLs may have the same conductivity as a whole. At least, surfaces of the semiconductor pillars PLs may have the same conductivity. Channels of the nonvolatile memory devices according to the embodiments of the inventive concept may be formed in the semiconductor pillars PLs.

Floating gates FGs may be interposed between sides of the semiconductor pillars PLs and the word lines WLs. Furthermore, the floating gates FGs may be interposed between the interlayer insulating layers 110 (see FIG. 2) adjacent to each other. That is, the floating gates FGs may be spaced from each other by the interlayer insulating layers 110 (see FIG. 2). For instance, the floating gates FGs may surround the semiconductor pillars PLs in the form of a doughnut or ring between the interlayer insulating layers 110 (see FIG. 2). At this time, a gate insulating layer 143 may selectively be interposed between the side of the semiconductor pillar PL and the floating gates FGs. Except for a surface coming in contact with the gate insulating layer 143, the remaining surface of the floating gate FG may be surrounded by an inter-gate dielectric layer IGD. That is, the inter-gate dielectric layer IGD may be interposed between the floating gate FG and the word line WL and between the floating gate FG and the interlayer insulating layer 110 (see FIG. 2).

The gate insulating layer 143 may be interposed between the semiconductor pillar PL and a selection line pattern SLP. The selection line pattern SLP may be surrounded by a middle gate dielectric layer MGD, similar to the floating gate FG is surrounded by the inter-gate dielectric layer IGD. The selection line pattern SLP may be made of the same material as the floating gate FG.

Accordingly, the gate insulating layers 143 surround the semiconductor pillars PLs, but may be spaced from the floating gates FGs.

Bit lines BLs may be formed on upper surfaces of the semiconductor pillars PLs to electrically connect with the semiconductor pillars PLs. The bit lines BLs may be disposed to intersect with the upper selection lines USLs. At this time, each of the semiconductor pillars PLs may be disposed at places where the bit lines BLs and the upper selection lines USLs are intersected with each other.

A perpendicular interval between the floating gates FGs may be adjusted depending on a thickness of the interlayer insulating layer. In addition, the thickness of the interlayer insulating layer may be determined not by a patterning process but by a thin film forming process. Therefore, the thickness of the interlayer insulating layer may be thinner than a limit of a patterning resolution. As a result, according to these embodiments of the inventive concept, the nonvolatile memory device including the floating gates may be operated using a fringe field. As described above, all of the semiconductor pillars according to this embodiment of the inventive concept may have the same impurity type. Furthermore, the impurity type of the semiconductor pillars according to this embodiment of the inventive concept may be a conductivity type opposite to the impurity type pf the floating gates.

A nonvolatile memory device according to a second embodiments of the inventive concept will be described below with reference to FIGS. 4 and 5. Hereinafter, with respect to the nonvolatile memory device according to the first embodiment of the inventive concept, same or similar components will be omitted or briefly described, and different components (e.g., gate insulating layer and inter-gate dielectric layer) will be described.

Figure 4:
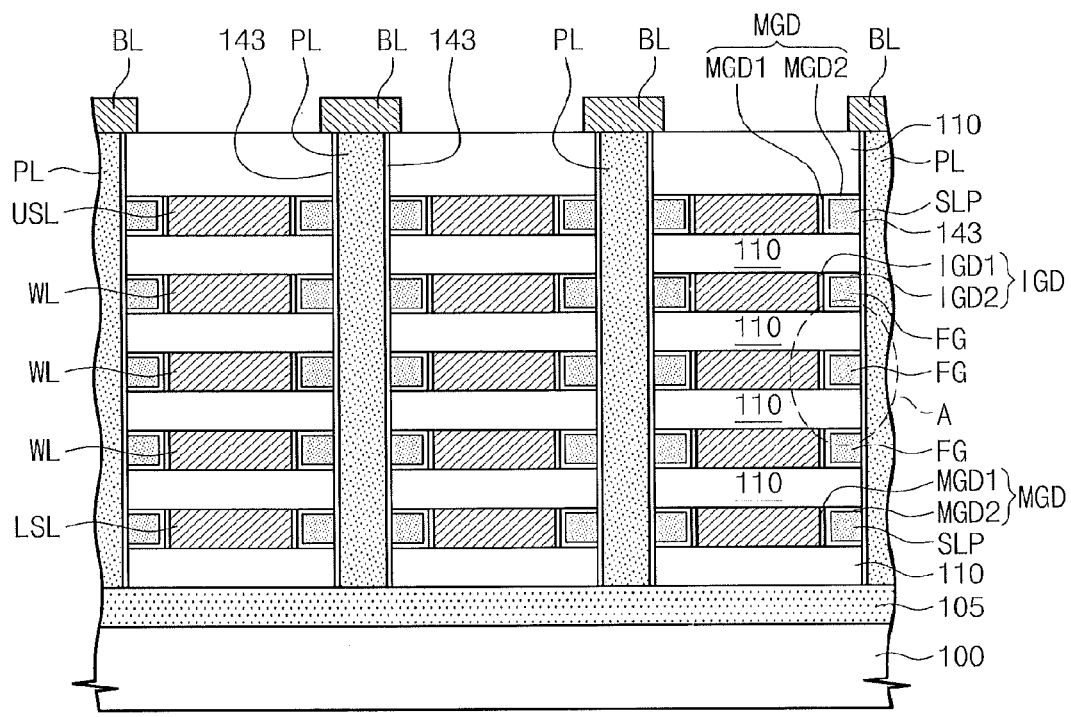
Figure 5:
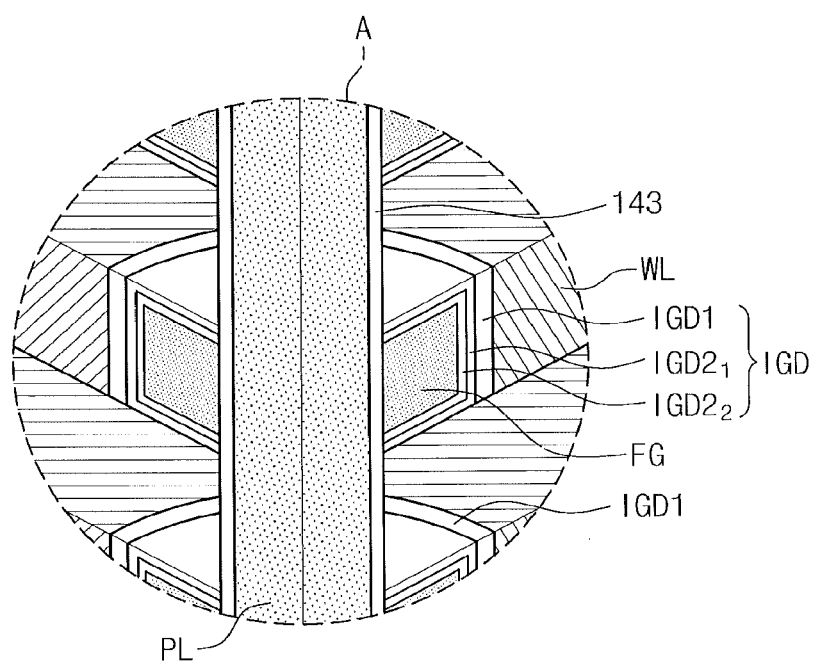

Referring to FIGS. 4 and 5, the gate insulating layer 143 may be interposed between the side of the semiconductor pillar PL and the floating gates FGs and interposed between the side of the semiconductor pillar PL and the interlayer insulating layer 110 (see FIG. 4). That is, the gate insulating layer 143 may extend along the side of the semiconductor pillar PL to surround the entire side of the semiconductor pillar PL.

Except for a surface coming in contact with the gate insulating layer 143, the remaining surface of the floating gate FG may be surrounded by the inter-gate dielectric layer IGD. The inter-gate dielectric layer IGD may be configured to have a plurality of layers IGD1, IGD2$_1$, and IGD2$_2$. According to other embodiments of the inventive concept, the inter-gate dielectric layer IGD may be configured to have a multi-layered structure only between the floating gate FG and the word lines WLs.

The selection line pattern SLP may be surrounded by the middle gate dielectric layer MGD including double layers MGD1 and MGD2 in a similar manner as the floating gate FG.

A three-dimensional nonvolatile memory device will be described below with reference to FIGS. 6 and 7. Hereinafter, with respect to the nonvolatile memory device according to the first and second embodiments of the inventive concept, same or similar components will be omitted or briefly described, and different components (e.g., selection line layer) will be described.

Figure 6:
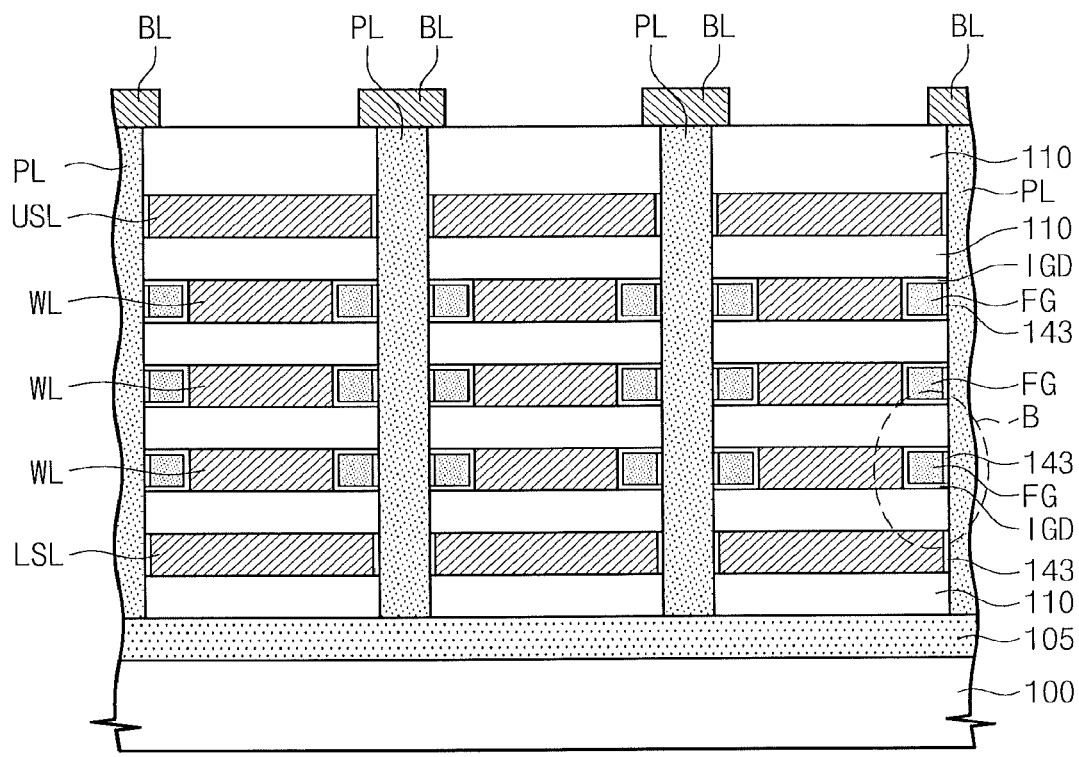
Figure 7:
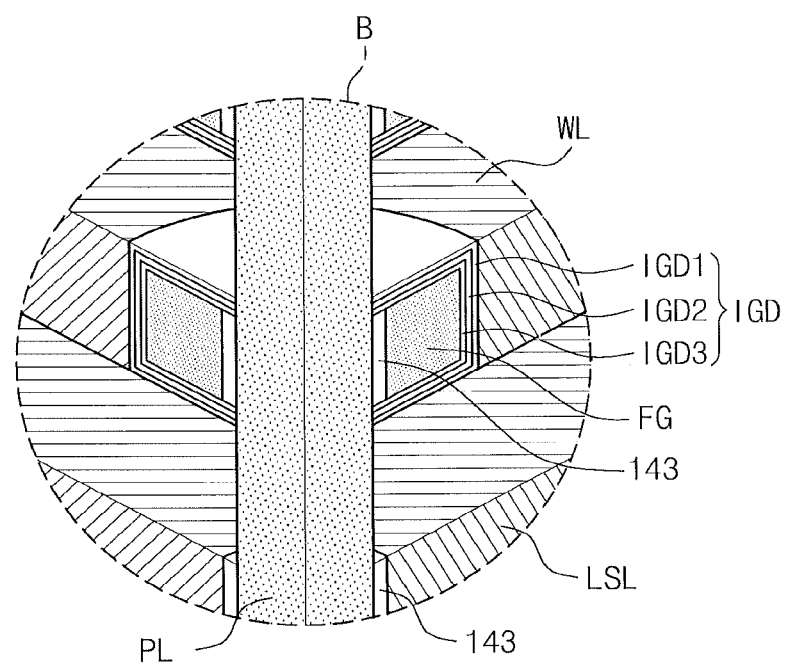

Referring to FIGS. 6 and 7, the floating gates FGs may selectively be interposed only between the side of the semiconductor pillar PL and the word lines WLs. In addition, the floating gates FGs are interposed between the interlayer insulating layers 110 (see FIG. 6) adjacent to each other and may perpendicularly be spaced from one another along the semiconductor pillar PL. At this time, the gate insulating layer 143 may locally be interposed between the side of the semiconductor pillar PL and the floating gates FGs. Alternatively, the gate insulating layer 143 may extend along the side of the semiconductor pillar PL. Except for a surface coming in contact with the gate insulating layer 143, the remaining surface of the floating gate FG may be surrounded by the inter-gate dielectric layer IGD. The inter-gate dielectric layer IGD may have a stacked structure of oxide/nitride/oxide (IGD1/IGD2/IGD3).

The gate insulating layer 143 may be only interposed between the selection lines USL and LSL and the semiconductor pillar PL. That is, unlike FIG. 2 or FIG. 4, the memory device of FIG. 6 may not include a different conductivity pattern such as a floating gate between the selection lines USL and LSL and the semiconductor pillar PL.

A three-dimensional nonvolatile memory device will be described below with reference to FIGS. 8 and 9. Hereinafter, with respect to the nonvolatile memory devices according to the first to third embodiments of the inventive concept, same or similar components will be omitted or briefly described, and different components (e.g., selection line layer) will be described.

Figure 8:
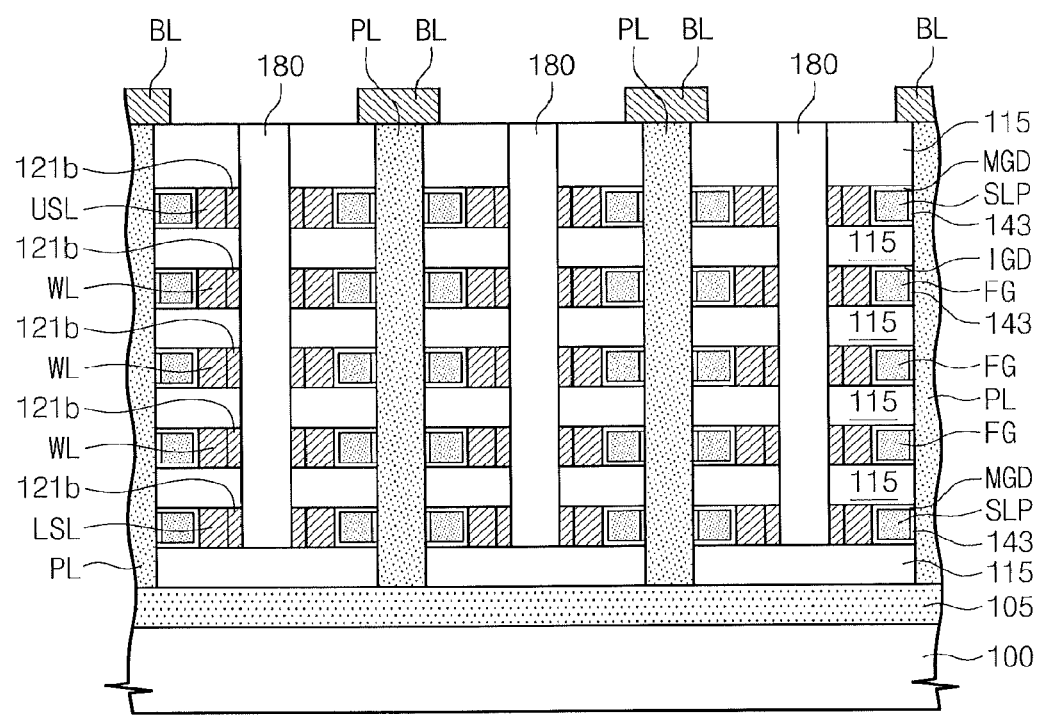
Figure 9:
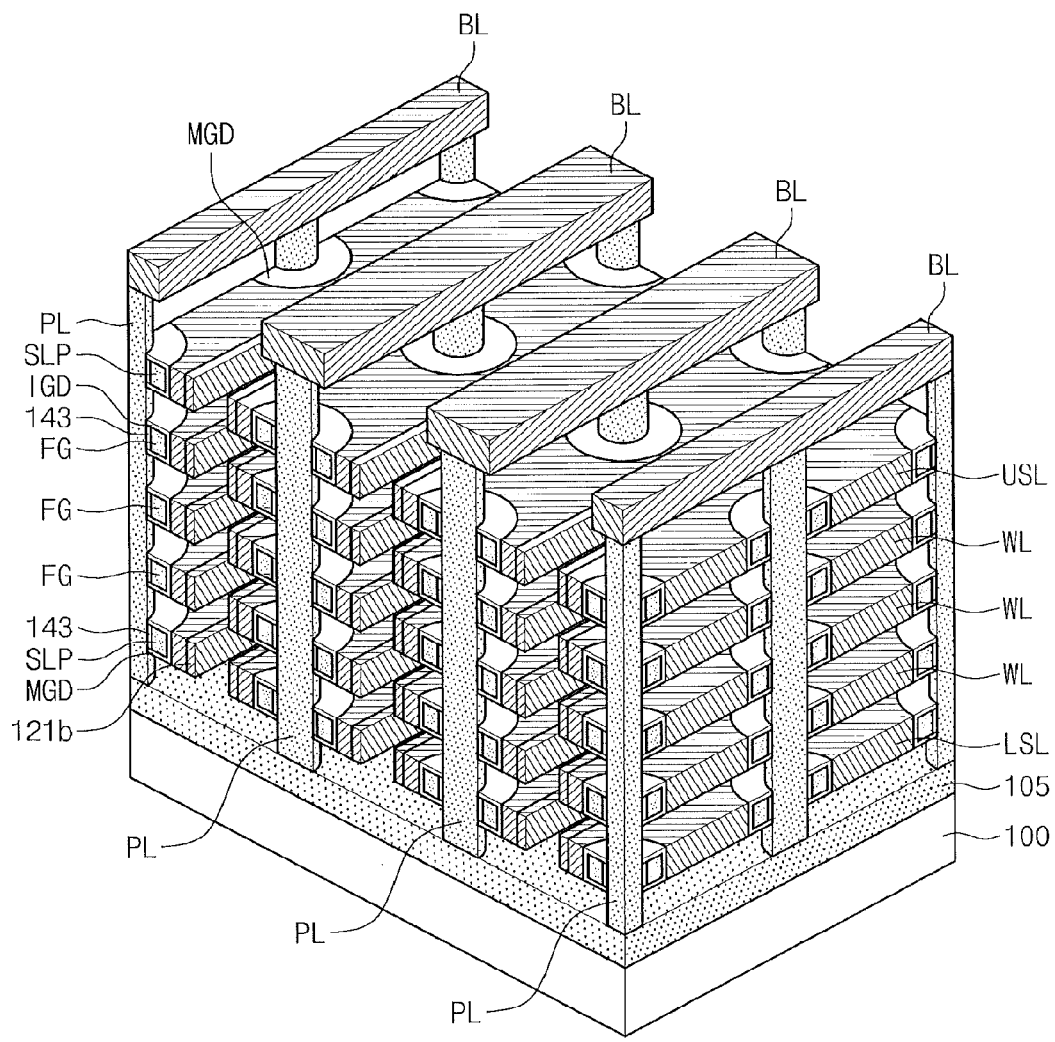

Referring to FIGS. 8 and 9, interlayer insulating patterns 115 and conductive line patterns LSL, WL, and USL may alternately be stacked on a substrate 100, repeatedly. Out of the conductive line patterns LSL, WL, and USL, the uppermost layer may be used as an upper selection line USL, the lowermost layer may be used as a lower selection line LSL, and remaining conductive line patterns may be used as word lines WLs.

The conductive line patterns LSL, WL, and USL may be a line shape extending in the same direction. One stack constituted by the conductive line patterns LSL, WL, and USL may be isolated from a neighboring stack. At this time, the conductive line patterns used as word lines WLs may be connected to each other on the same layer such that the same voltage is applied thereto.

Line-shaped isolation insulating pattern 180 may be disposed between the adjacent conductive line patterns LSL, WL, and USL.

A plurality of semiconductor pillars PLs, which penetrate the stacked interlayer insulating patterns 115 and the conductive line patterns LSL, WL, and USL, may be disposed on the substrate 100. The semiconductor pillars PLs may be spaced from each other in a row between the adjacent isolation insulating patterns 180. The semiconductor pillars PLs may be arranged in the form of a planar matrix.

Silicide layers 121b may be interposed into interfaces between the isolation insulating patterns 180 and the conductive line patterns LSL, WL, and USL. The silicide layers 121b may locally be disposed at the surface of the conductive line patterns LSL, WL, and USL coming in contact with the isolation insulating patterns 180.

Methods of fabricating the three-dimensional nonvolatile memory devices according to the embodiments of the inventive concept will be described below.

FIGS. 10 through 16 illustrate methods of fabricating a three-dimensional nonvolatile memory device according to first embodiments of the inventive concept.

Figure 10:
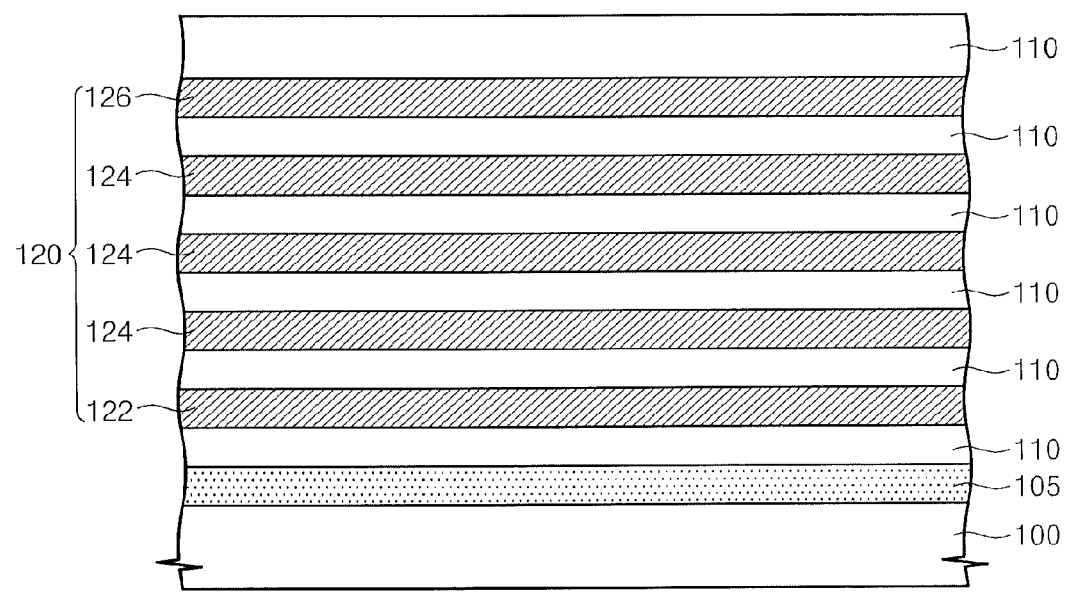
FIGS. 10 through 16 are cross-sectional views illustrating methods of fabricating a nonvolatile memory device according to some embodiments of the inventive concept, respectively.

Referring to FIG. 10, interlayer insulating layers 110 and conductive layers 120 may alternately be stacked on a substrate 100, repeatedly. The substrate 100 may include an impurity region 105 (for example, well region). Out of the stacked layers 110 and 120, the uppermost layer may be an interlayer insulating layer. The number of stacked conductive layers may be changed by the capacity of the nonvolatile memory device. The interval between the conductive layers 120 may be determined by adjusting the thickness of the interlayer insulating layers 110.

The interlayer insulating layers 110 and the conductive layers 120 may be stacked in the form of a plate on a memory cell of the substrate 100

At this time, with respect to the interlayer insulating layers 110 and the conductive layers 120, the area may gradually reduce in the order in which the interlayer insulating layers 110 and the conductive layers 120 are stacked from the substrate 100. For instance, edges of the interlayer insulating layers 110 and the conductive layers 120 may have a staircase shape. The interlayer insulating layers 110 and the conductive layers 120 may be formed by repeatedly carrying out a depositing process and a patterning process, respectively. Alternatively, after all of the interlayer insulating layers 110 and the conductive layers 120 are stacked, each layer may selectively be patterned layer-by-layer.

The interlayer insulating layers 110 may include a silicon oxide layer and/or a silicon nitride layer. The conductive layers 120 may include a lower conductive layer 122 and an upper conductive layer 126 that are sequentially stacked from the substrate 100. A middle conductive layer 124 may be stacked between the lower conductive layer 122 and the upper conductive layer 126. The lower conductive layer 122, the upper conductive layer 126, and the middle conductive layer 124 may have the same etch selectivity. For instance, the lower conductive layer 122, the upper conductive layer 126, and the middle conductive layer 124 may be formed of the same material. The conductive layers may contain polysilicon and/or metal material.

The upper conductive layer 126 may be patterned in the form of a line.

Figure 11:
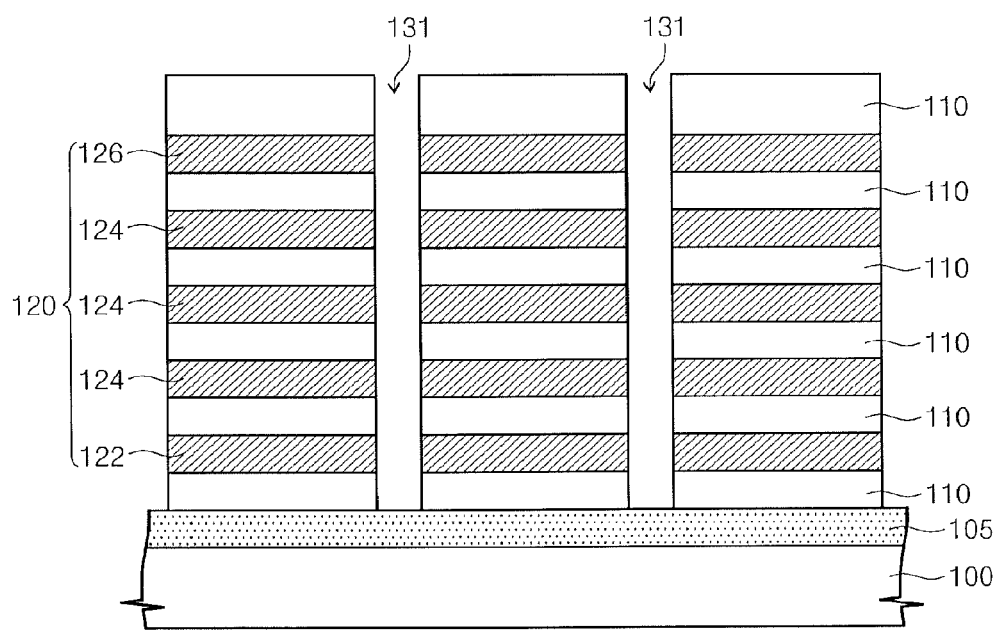

Referring to FIG. 11, a plurality of first openings 131 may be formed by etching the stacked interlayer insulating layers 110 and the conductive layers 120. The first openings 131 penetrate the stacked interlayer insulating layers 110 and the conductive layers 120. For instance, a mask pattern (not illustrated) is formed on the uppermost layer of the interlayer insulating layers 110, and an anisotropic etching is selectively performed on the interlayer insulating layers 110 and the conductive layers 120 exposed by the mask pattern. The impurity region 105 of the substrate 100 may be exposed to bottom faces of the first openings 131, and the interlayer insulating layers 110 and the conductive layers 120 may be exposed to inner walls of the first openings 131. The first openings 131 may be a circular type, and the diameter of the first openings 131 may be smaller than a horizontal distance between the adjacent first openings 131. Furthermore, the first openings 131 may be provided in the form of a planar matrix.

Figure 12:
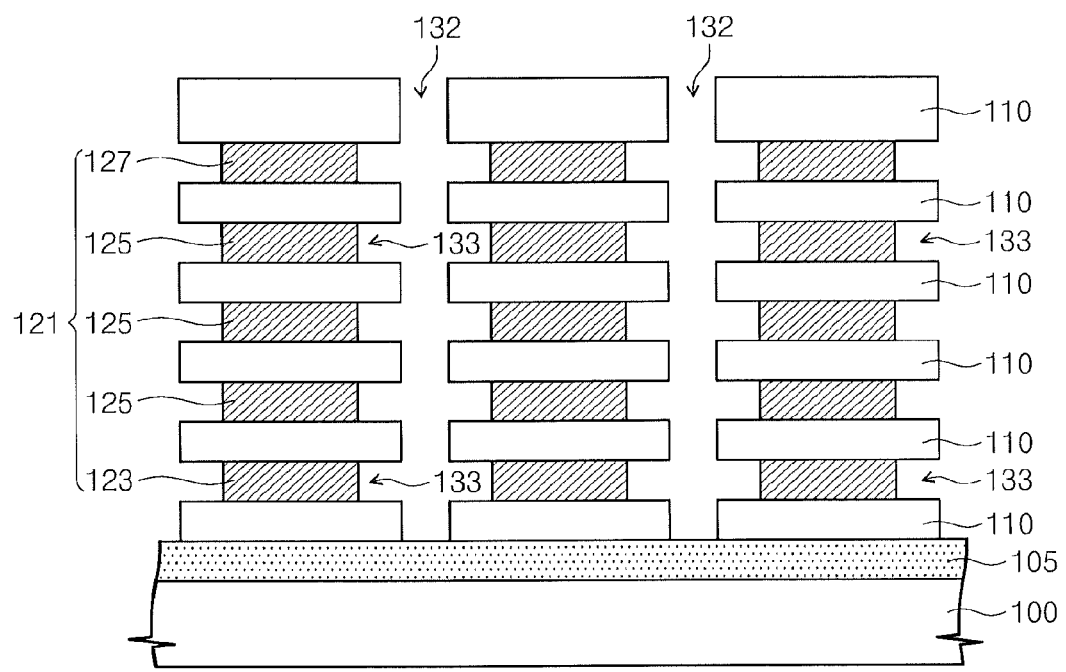

Referring to FIGS. 11 and 12, conductive patterns 121 may be formed by selectively recessing the conductive layers 120 exposed to the inner walls of the first openings 131. For instance, an isotropic etching may be performed on the resulting structure of FIG. 11. The isotropic etching may be performed such that the conductive layers 120 are selectively etched compared to other layers. The conductive patterns 121 may include a lower conductive pattern 123 and an upper conductive pattern 127 that are sequentially stacked from the substrate 100. Middle conductive patterns 125 may be stacked between the lower conductive pattern 123 and the upper conductive pattern 127. The middle conductive patterns 125 may be used as a control gate (or word line). When the conductive patterns 121 are formed, at the same time the inner walls of the first openings 131 constituted by the conductive layers 120 are selectively expanded. Consequently, second openings 132 may be formed.

The second openings 132 may have the same bottom face as the first openings 131. Meanwhile, the inner walls of the second openings 132 may be constituted by the interlayer insulating layers 110 and the conductive patterns 121. The second openings 132 may include expansions 133 surrounded by the adjacent interlayer insulating layers 110 and the conductive patterns 121 between the adjacent interlayer insulating layers 110. The width or diameter of the expansions 133 may be larger than that of the openings surrounded by the interlayer insulating layers 110. Accordingly, the expansions 133 may be viewed as expansions relative to the openings 132 or may be viewed as recesses relative to the interlayer insulating layers 110. Stated differently, sidewalls of the conductive patterns 125 that are exposed by the openings 132 are recessed relative to sidewalls of the interlayer insulating layers 110 that are exposed by the openings, to thereby define expansions 133 between portions of adjacent insulating layers that are exposed by the recessing of the sidewalls of the conductive layers 127.

Figure 13:
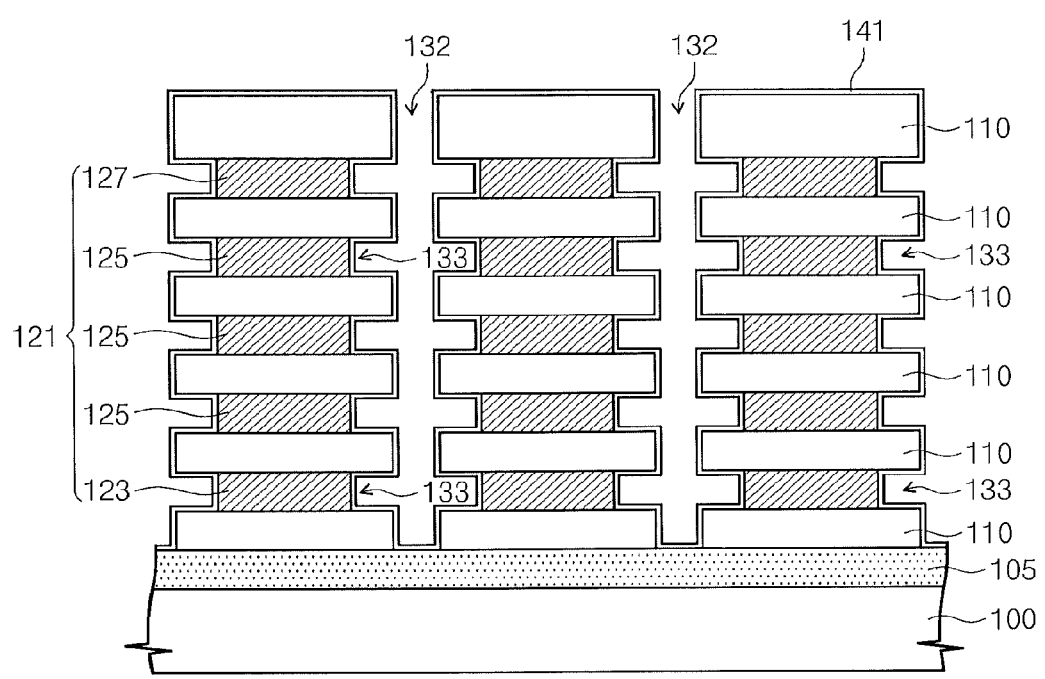

Referring to FIG. 13, a first insulating layer 141 may be formed on the resulting structure of FIG. 12. The first insulating layer 141 may conformally be formed on the resulting structure of FIG. 12. That is, the first insulating layer 141 may be formed along the inner walls and the bottom faces of the second openings 132. At this time, the first insulating layer 141 may be formed on the surfaces of the interlayer insulating layers 110 and the conductive patterns 121 exposed to the inner faces of the expansions 133. The first insulating layer 141 may be a single layer or multiple layers. The first insulating layer 141 may be a composite layer of oxide/nitride/oxide. According to another embodiment of the inventive concept, the first insulating layer 141 may be formed of high dielectric constant materials.

The first insulating layer 141 may be formed by a deposition. For instance, the first insulating layer 141 may be formed by an atomic layer deposition (including modified process of atomic layer deposition) and/or a chemical vapor deposition (including modified processes such as Low Pressure Chemical Vapor Deposition and Plasma Enhanced Chemical Vapor Deposition).

Figure 14:
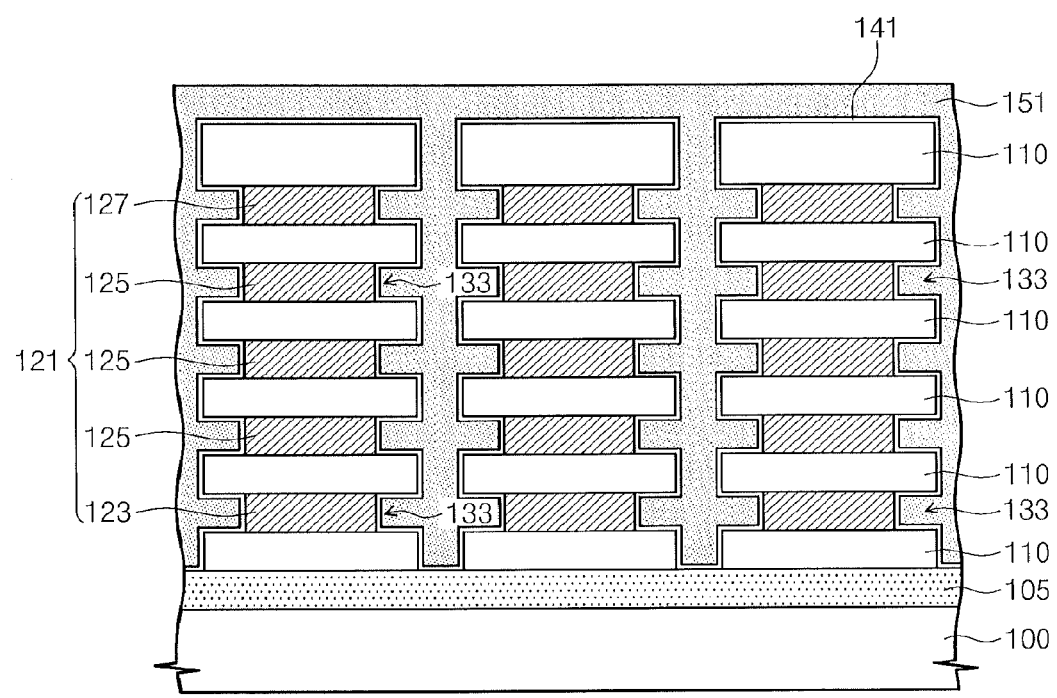

Referring to FIG. 14, a buried conductive layer 151 may be formed to fill the inside of the second openings 132. The buried conductive layer 151 may fill the expansions 133. The buried conductive layer 151 may be formed to cover the uppermost layer of the interlayer insulating layers. The buried conductive layer 151 may be formed of a conductive polysilicon.

Figure 15:
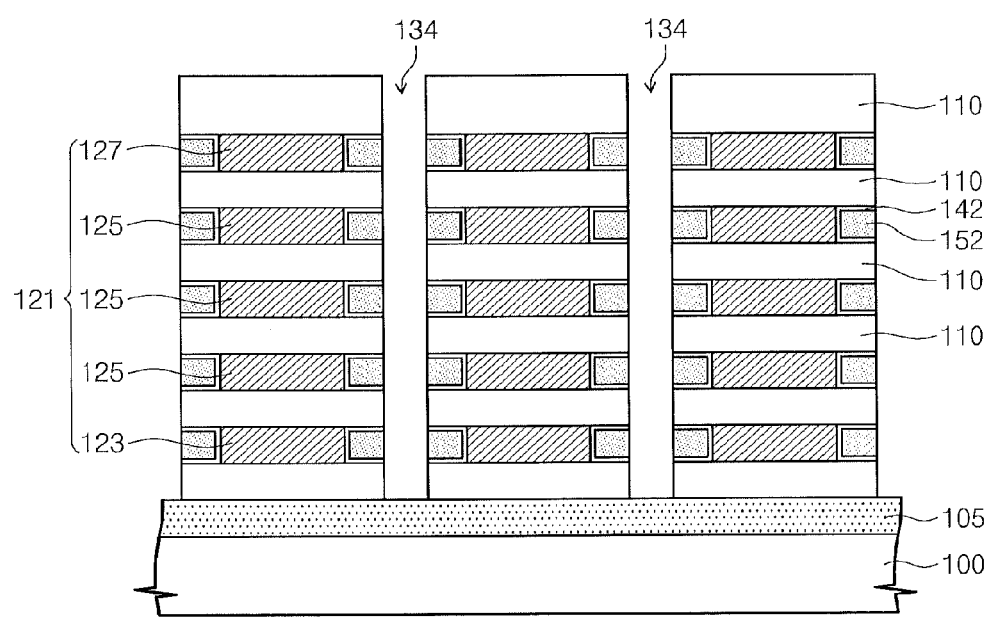

Referring to FIG. 15, third openings 134 may be formed by performing the anisotropic etching with respect to the buried conductive layer 151. The anisotropic etching may be performed using the interlayer insulating layers 110 as an etching mask. The anisotropic etching may be performed to expose the upper surface of the substrate 100. Hereby, since a part of the buried conductive layer 151 remains in the expansions 133, buried conductive patterns 152 may be formed. In addition, since the first insulating layer 141 formed on the inner walls of the second openings 132, except for the expansions 133, is selectively removed by the anisotropic etching, first insulating patterns 142 may locally be formed in the expansions 133. Accordingly, the interlayer insulating layers 110 and the buried conductive patterns 152 may be exposed to the inner walls of the third openings 134. At this time, the first insulating patterns 142 may surround other surfaces of the buried conductive patterns 152 except for the side exposed to the inner walls of the third openings 134.

Alternatively, a planarization process may be performed on the buried conductive layer 151 to expose the upper surface of the uppermost layer of the interlayer insulating layers 110. Subsequently, a mask pattern (not illustrated) may be formed on the uppermost layer of the interlayer insulating layers 110 to expose the buried conductive layer 151 formed in the second openings 132. The anisotropic etching may selectively be performed on the buried conductive layer 151 using the mask pattern as an etching mask. After the buried conductive layer 151 is etched, the third openings 134 may be formed by removing the first insulating layer 141 formed on the bottom face of the exposed second openings 132. At this time, the first insulating layer 141 may remain on the sidewalls of the third openings 134. That is, the first insulating patterns 142, which surround the buried conductive patterns of different layers, may be connected to each other along the inner walls of the third openings 134.

Figure 16:
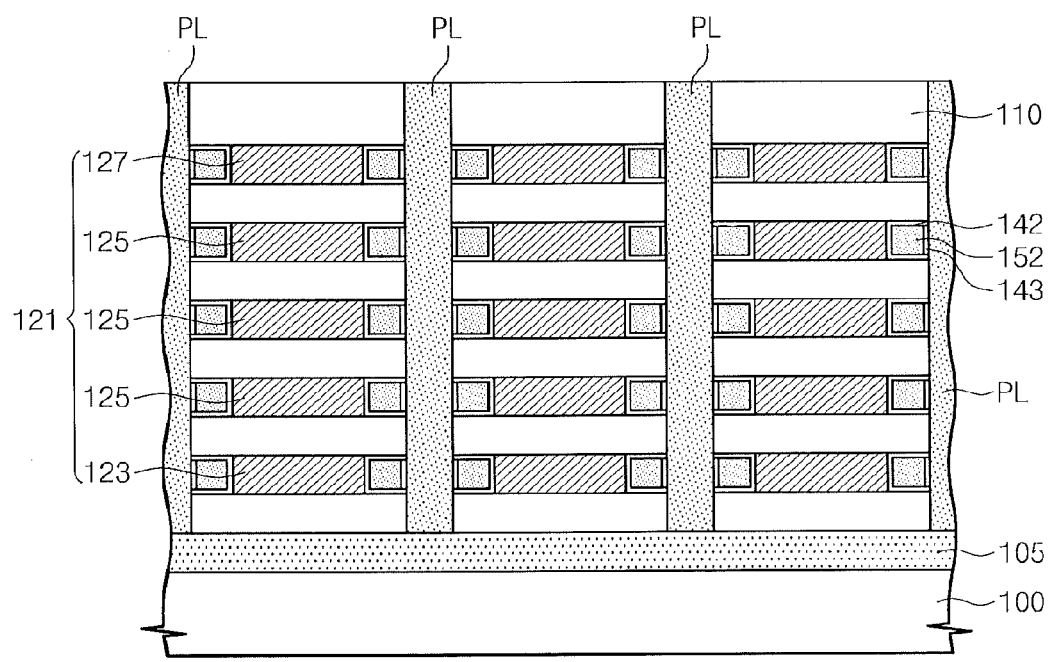

Referring to FIG. 16, an oxidation process may be performed on the resulting structure of FIG. 15. The oxidation process may be a thermal oxidation. Through the oxidation, an oxide layer may be formed on the surfaces of the buried conductive patterns 152 exposed to the inner walls of the third openings 134. At this time, the upper surface of the substrate 100, which is exposed to the bottom faces of the third openings 134, may be also oxidized. The oxide layer formed on the bottom faces of the third openings 134 may be removed by the anisotropic etching. As a result, a gate insulating layer 143 may selectively be formed on the surface of the buried conductive patterns 152 exposed to the inner walls of the third openings 134. The gate insulating layer 143 may be also formed by a radical oxidation process.

The third openings 134 may be filled with semiconductor materials. At this time, the uppermost layer of the interlayer insulating layers 110 may be covered with the semiconductor materials. The uppermost layer of the interlayer insulating layers 110 is exposed by the planarization process, and the semiconductor pillars PLs may then be formed in the third openings 134. The semiconductor materials may include polycrystalline or single crystalline semiconductor.

The bit lines BLs may be formed on the semiconductor pillars PLs. A conductive layer is formed on the semiconductor pillars PLs and the uppermost layer of the interlayer insulating layers 110. The bit lines BLs may then be formed by patterning the conductive layer. For this reason, the semiconductor pillars PLs may electrically be connected to the bit lines BLs.

Figure 17:
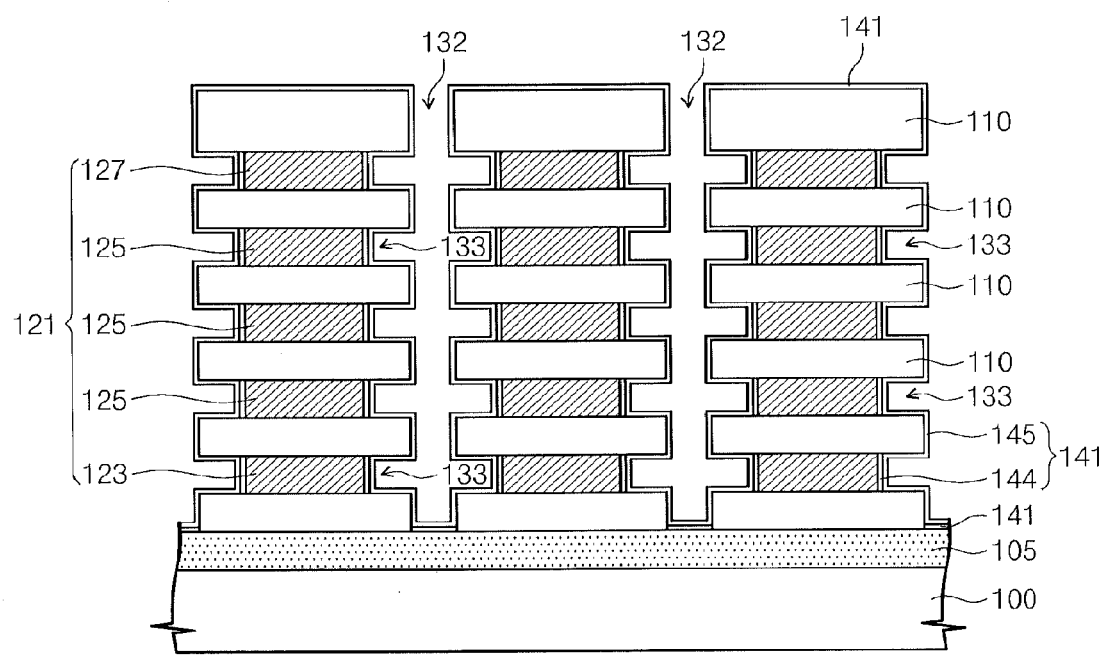
FIGS. 17 and 18 are cross-sectional views illustrating methods of fabricating a nonvolatile memory device according to other embodiments of the inventive concept, respectively.
Figure 18:
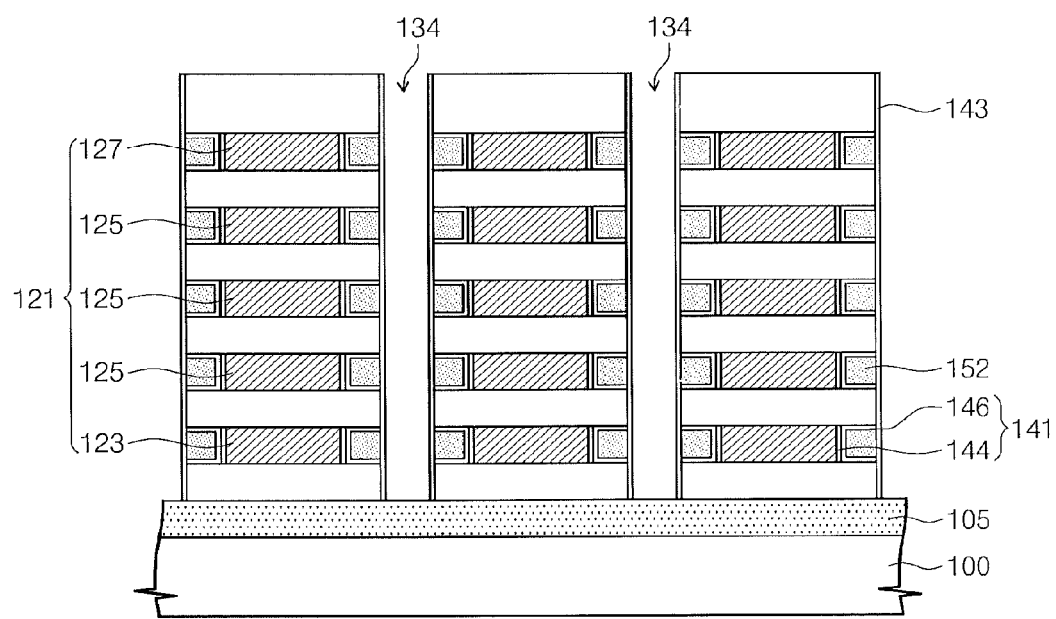

FIGS. 17 and 18 illustrate methods of fabricating a three-dimensional nonvolatile memory device according to second embodiments of the inventive concept. With respect to the method of fabricating the three-dimensional nonvolatile memory device according to the first embodiment of the inventive concept, same or similar components will be omitted or briefly described.

Referring to FIG. 17, a first insulating layer 141 may be formed on the resulting structure of FIG. 12. The first insulating layer 141 may be double layers. The first insulating layer 141 may include a first sub-insulating layer 144 and a second sub-insulating layer 145. The first sub-insulating layer 144 may be formed by an oxidation process. Accordingly, the first sub-insulating layer 144 may selectively be formed on the exposed surface of the conductive patterns 121. Moreover, the upper surface of the substrate 100 may be oxidized by the oxidation process.

The second sub-insulating layer 145 may conformally be formed on the resulting structure. That is, the second sub-insulating layer 145 may be formed along the inner walls of the second openings 132, the expansions 133, and the bottom faces of the second openings 132. The second sub-insulating layer 145 may be formed of high dielectric constant materials. The second sub-insulating layer 145 may be formed by a deposition. As a result, the first sub-insulating layer 144 and the second sub-insulating layer 145 may selectively be stacked on the exposed surface of the conductive patterns 121.

Referring to FIG. 18, as described above, the buried conductive patterns 152 containing a conductive polysilicon are formed in the expansions 133, and the third openings 134 may be formed. In this case, the buried conductive patterns 152 correspond to the sides of the third openings 134. Furthermore, since the second sub-insulating layer 145 formed on the inner walls of the third openings 134, except for the expansions 133, is selectively removed by the anisotropic etching, second sub-insulating patterns 146 may be formed in the expansions 133. Accordingly, the interlayer insulating layers 110 and the buried conductive patterns 152 may be exposed to the inner walls of the third openings 134. At this time, the second sub-insulating patterns 146 may surround other surfaces of the buried conductive patterns 152 except for the side exposed to the inner walls of the third openings 134.

Alternatively, the second sub-insulating patterns 146, which surround the buried conductive patterns of different layers, may be connected to each other along the inner walls of the third openings 134.

The gate insulating layer 143 may selectively be formed on the inner walls of the third openings 134. The gate insulating layer 143 may be formed by a deposition and an anisotropic etching. For instance, the gate insulating layer 143 may be formed by an atomic layer deposition (including modified process of atomic layer deposition) and/or a chemical vapor deposition (including modified processes such as Low Pressure Chemical Vapor Deposition and Plasma Enhanced Chemical Vapor Deposition). The insulating layer may conformally be formed on the resulting structure by the deposition. Subsequently, through the anisotropic etching, it can remove the insulating layer formed on the bottom faces of the third openings 134 and the uppermost layer of the interlayer insulating layers 110.

Referring back to FIG. 4, the semiconductor pillars PLs may be formed in the third openings 134. The semiconductor pillars PLs may have the upper surfaces that are substantially equal to the uppermost layer of the interlayer insulating layers 110 in height. The semiconductor materials may include polycrystalline and/or single crystalline semiconductor. The bit lines BLs may be formed on the semiconductor pillars PLs.

FIGS. 19 through 29 illustrate methods of fabricating a three-dimensional nonvolatile memory device according to third embodiments of the inventive concept.

Figure 19:
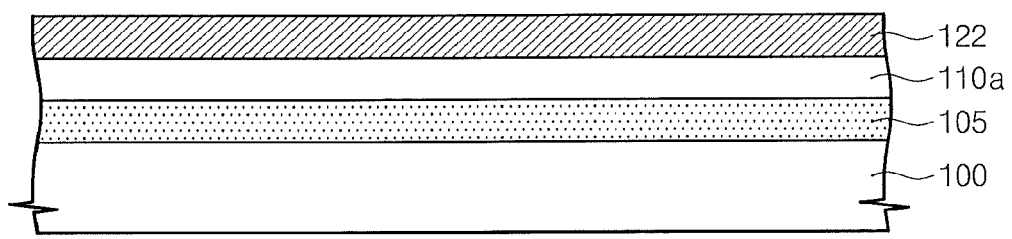
FIGS. 19 through 28 are cross-sectional views illustrating methods of fabricating a nonvolatile memory device according to further embodiments of the inventive concept, respectively.

Referring to FIG. 19, a lower interlayer insulating layer 110a and a lower conductive layer 122 may be stacked on the substrate 100 in this order. The substrate 100 may include the impurity region 105 (for example, well region).

Figure 20:
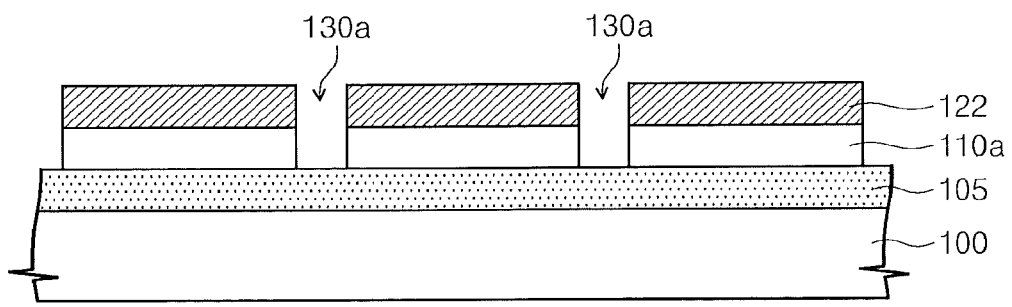

Referring to FIG. 20, a mask pattern (not illustrated) may be formed on the lower conductive layer 122. The anisotropic etching may selectively be performed on the lower conductive layer 122 using the mask pattern as an etching mask. For this reason, lower openings 130a penetrating the lower conductive layer 122 may be formed. At this time, the lower openings 130a may be formed to expose the lower interlayer insulating layer 110a and the substrate 110. The mask pattern may be removed.

Figure 21:
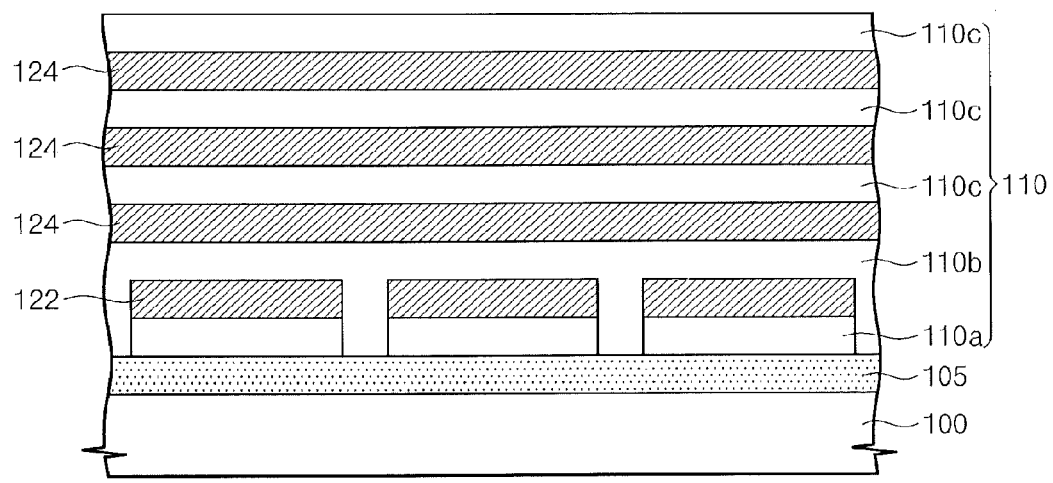

Referring to FIG. 21, a middle buried insulating layer 110b may be formed on the substrate 100 to fill the lower openings 130a. Middle conductive layers 124 and middle interlayer insulating layers 110c may alternately be stacked on the middle buried insulating layer 110b. Before the middle conductive layers 124 are formed, the middle buried insulating layer 110b may be planarized. The middle buried insulating layer 110b on the lower conductive layer 122 may have the same thickness as the middle interlayer insulating layer 110c on the middle conductive layer 124.

Figure 22:
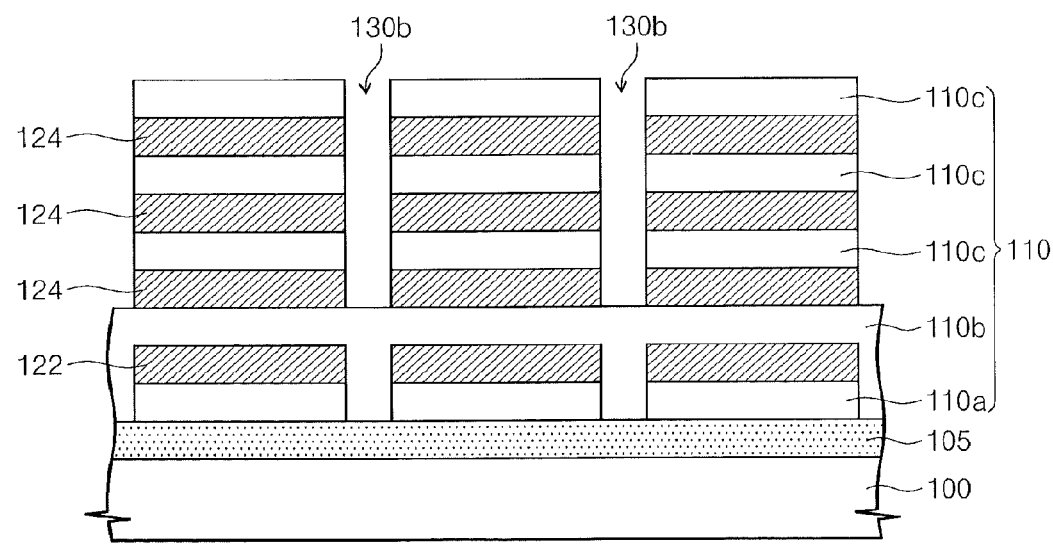

Referring to FIG. 22, a mask pattern (not illustrated) may be formed on the uppermost layer of the middle interlayer conductive layers 110c. The mask pattern may be formed using a mask equal to a photo mask used for forming the lower openings 130a. The anisotropic etching may selectively be performed on the middle conductive layers 124 and the middle interlayer insulating layers 110c using the mask pattern as an etching mask. For this reason, first middle openings 130b 130a may be formed to penetrate the middle conductive layers 124 and the middle interlayer insulating layers 110c. At this time, the anisotropic etching may be performed using the middle buried insulating layer 110b as an etch stop layer. An upper surface of the middle buried insulating layer 110b is exposed to the bottom face of the first middle openings 130b, and the middle conductive layers 124 and the middle interlayer insulating layers 110c may be exposed to the inner wall of the first middle openings 130b.

Figure 23:
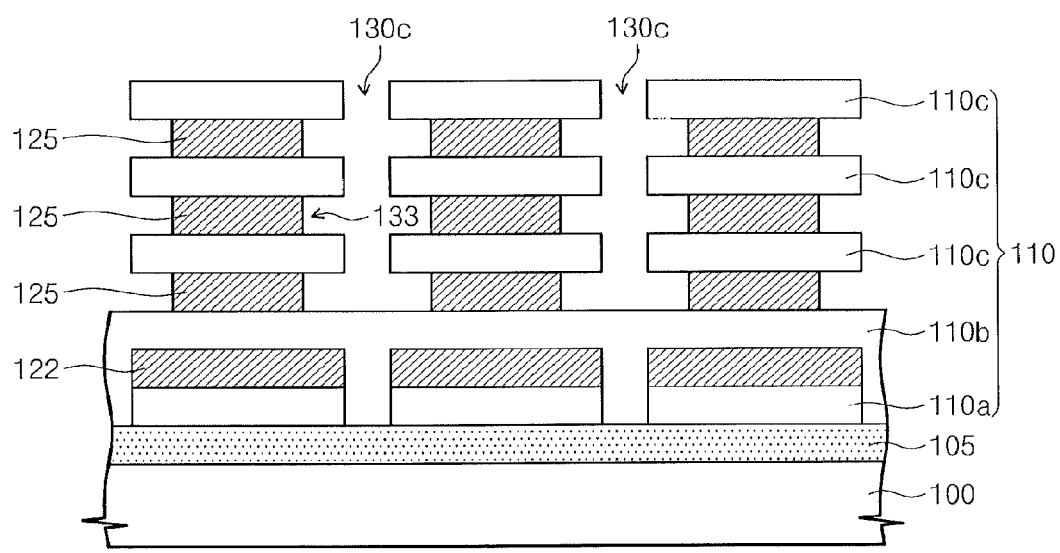

Referring to FIG. 23, the middle conductive layers 124, which are exposed to the inner wall of the first middle openings 130b, may selectively be recessed. For this reason, middle conductive patterns 125 may be formed. The middle conductive patterns 125 may be used as a control gate (or word line). At the same time, the inner walls of the first middle openings 130b, which are provided with the middle conductive layers 124, may selectively be expanded. Consequently, second middle openings 130c may be formed. For instance, the isotropic etching may be performed on the resulting structure of FIG. 22. The isotropic etching may be performed such that the middle conductive layers 124 are selectively etched compared to other layers.

The second middle openings 130c may have the same bottom face as the first middle openings 130b. Meanwhile, the inner walls of the second middle openings 130c may be provided with the middle interlayer insulating layers 110c and the middle conductive patterns 125. The second middle openings 130b may include expansions 133 surrounded by the neighboring interlayer insulating layers 110 and the middle conductive patterns 125 between the neighboring interlayer insulating layers 110. The diameter of the expansions 133 may be larger than that of the openings surrounded by the middle interlayer insulating layers 110c.

Figure 24:
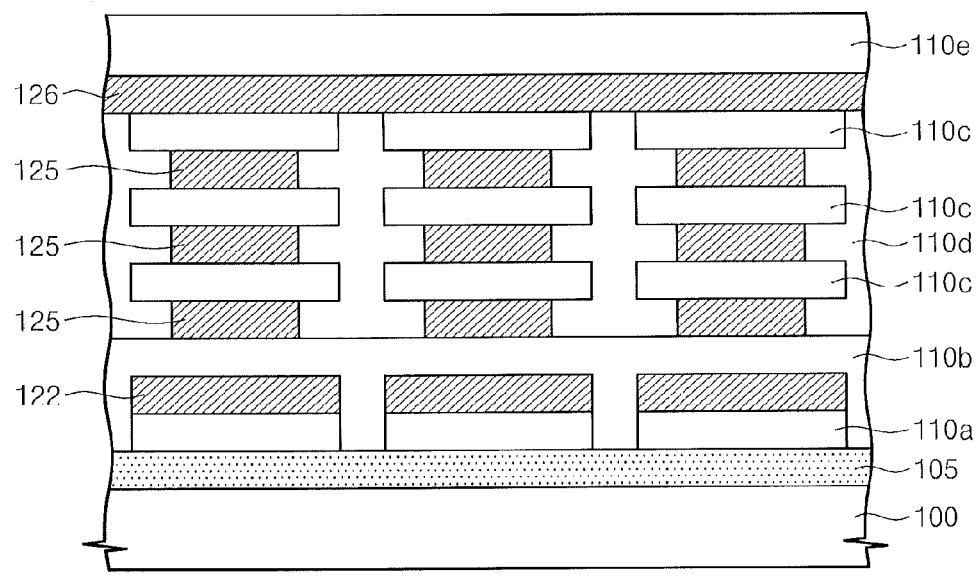

Referring to FIG. 24, a sacrificial pattern 110d may be formed to fill the second middle openings 130c. At this time, the sacrificial pattern 110d may be formed to fill the expansions 133. The sacrificial pattern 110d may be formed by the deposition and planarlization. The sacrificial pattern 110d may have the upper surface that is substantially equal to the uppermost layer of the middle interlayer insulating layers 110c in height. The sacrificial pattern 110d may be formed of materials having the etch selectivity with respect to the interlayer insulating layers 110 and the conductive layers 120. For instance, the interlayer insulating layers 110 may contain a silicon nitride, the conductive layers 120 may contain a conductive polysilicon and/or metal, and the sacrificial pattern 110d may contain a silicon oxide.

An upper conductive layer 126 and an upper interlayer insulating layer 110e may sequentially be stacked on the sacrificial pattern 110d and the uppermost layer of the middle interlayer insulating layers 110c. The upper conductive layer 126 may be patterned in the form of a line.

Figure 25:
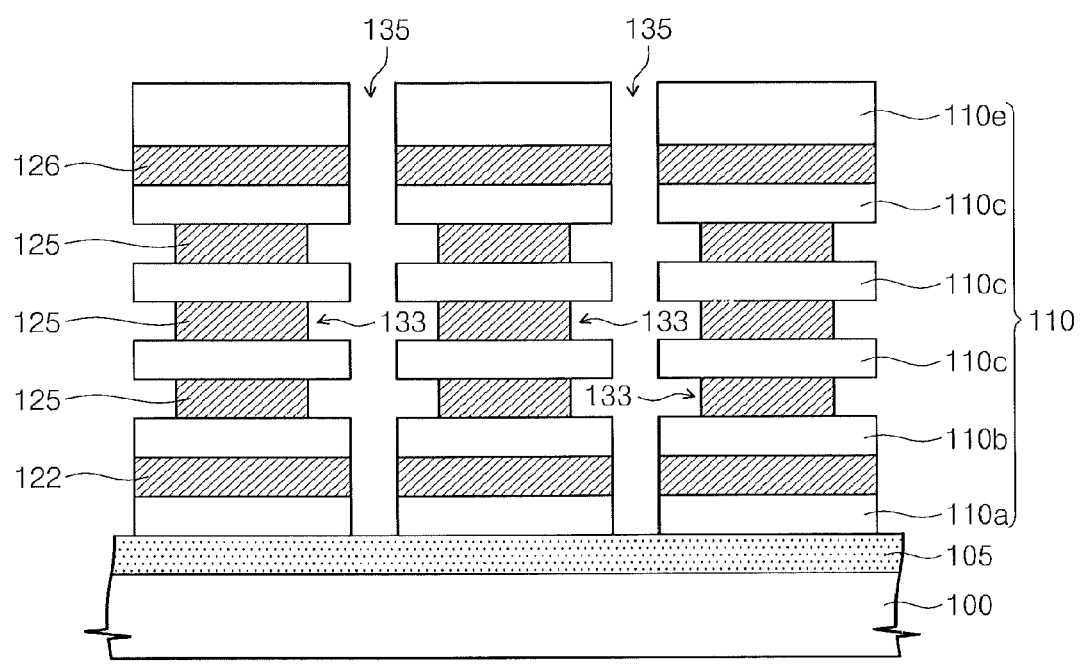

Referring to FIG. 25, a mask pattern (not illustrated) may be formed on the upper interlayer insulating layer 110e. The mask pattern may be formed using a mask (e.g., reticle) equal to a photo mask used for forming the lower openings 130a and/or the first middle openings 130b. The anisotropic etching may selectively be performed on the upper interlayer insulating layer 110e and the upper conductive layer 126 using the mask pattern as an etching mask. For this reason, an upper surface of the sacrificial pattern 110d may be exposed.

The sacrificial pattern 110d may selectively be removed. The sacrificial pattern 110d may be formed of materials having the etch selectivity different from that of the conductive layers 122 and 126, the conductive patterns 125, and the interlayer insulating layers 110. Accordingly, through the isotropic etching, the conductive layers 122 and 126, the conductive patterns 125, and the interlayer insulating layers 110 are not etched or are etched to a minimum, while the sacrificial pattern 110d may selectively be etched. The sacrificial pattern 110d is removed, and then the second middle openings 130c may be again formed.

The middle buried insulating layer 110b may be exposed to the bottom face of the second middle openings 130c. The anisotropic etching may selectively be performed on the exposed middle buried insulating layer 110b using the interlayer insulating layers 110 as an etching mask. Consequently, the first openings 135 may be formed to penetrate the upper conductive layer 126, the middle conductive patterns 125, and the lower conductive layer 122 and expose the upper surface of the substrate 100.

The substrate 100 may be exposed to the bottom face of the first openings 135. Further, the interlayer insulating layers 110, the conductive layers 122 and 126, and the conductive patterns 125 may be exposed to the inner wall of the first openings 135. At this time, the first openings 135 may be a circular type. In addition, the first openings 135 may be a planar matrix shape. The first openings 135 may have different diameter for each region. For instance, the diameter of the first openings 135 penetrating the interlayer insulating layers 110, the upper conductive layer 126, and the lower conductive layer 122 may be smaller than that of the first openings 135 penetrating the middle conductive patterns 125. That is, the first openings 135 may include the expansions 133 having a partially expansive diameter.

The interlayer insulating layers 110, the conductive layers 122 and 126, and the conductive patterns 125 may be stacked in the form of a plate on the memory cell of the substrate 100. At this time, with respect to the interlayer insulating layers 110, the conductive layers 122 and 126, and the conductive patterns 125, the area may gradually reduce in the order in which the interlayer insulating layers 110, the conductive layers 122 and 126, and the conductive patterns 125 are stacked from the substrate 100. For instance, edges of the interlayer insulating layers 110, the conductive layers 122 and 126, and the conductive patterns 125 may have a staircase shape.

The interlayer insulating layers 110 may be formed of a silicon oxide and/or a silicon nitride. At least the sacrificial pattern 110*d* may be formed of materials that are selectively etched during the etching compared to the upper interlayer insulating layer 110*e* and the middle buried insulating layer 110*b*.

The conductive layers 122 and 126 and the conductive patterns 125 may include a polysilicon layer or metal layer. Moreover, the conductive layers 122 and 126 and the conductive patterns 125 may be formed of the same material or different material. At this time, at least the middle conductive patterns 125 may be formed of the same material.

Figure 26:
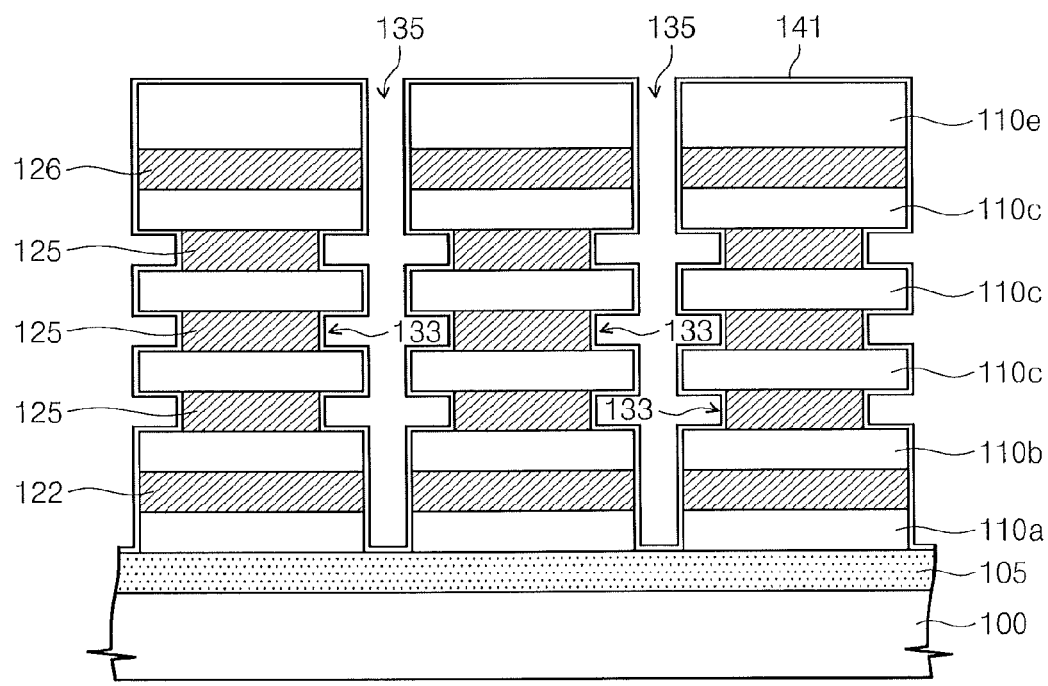

Referring to FIG. 26, a first insulating layer 141 may conformally be formed on the resulting structure of FIG. 21. That is, the first insulating layer 141 may be formed along the inner walls and the bottom face of the first openings 135. At this time, the first insulating layer 141 may be formed on the surfaces of the interlayer insulating layers 110 and the middle conductive patterns 125 exposed to the inner face of the expansions 133. The first insulating layer 141 may be a single layer or multiple layers. The first insulating layer 141 may be formed of high dielectric constant materials.

The first insulating layer 141 may be formed by the deposition. For instance, the first insulating layer 141 may be formed by an atomic layer deposition (including modified process of atomic layer deposition) and/or a chemical vapor deposition (including modified processes such as Low Pressure Chemical Vapor Deposition and Plasma Enhanced Chemical Vapor Deposition). The first insulating layer 141 may further include an oxide layer that is selectively formed on the surface of the middle conductive patterns 125 exposed to the inner wall of the first openings 135.

Figure 27:
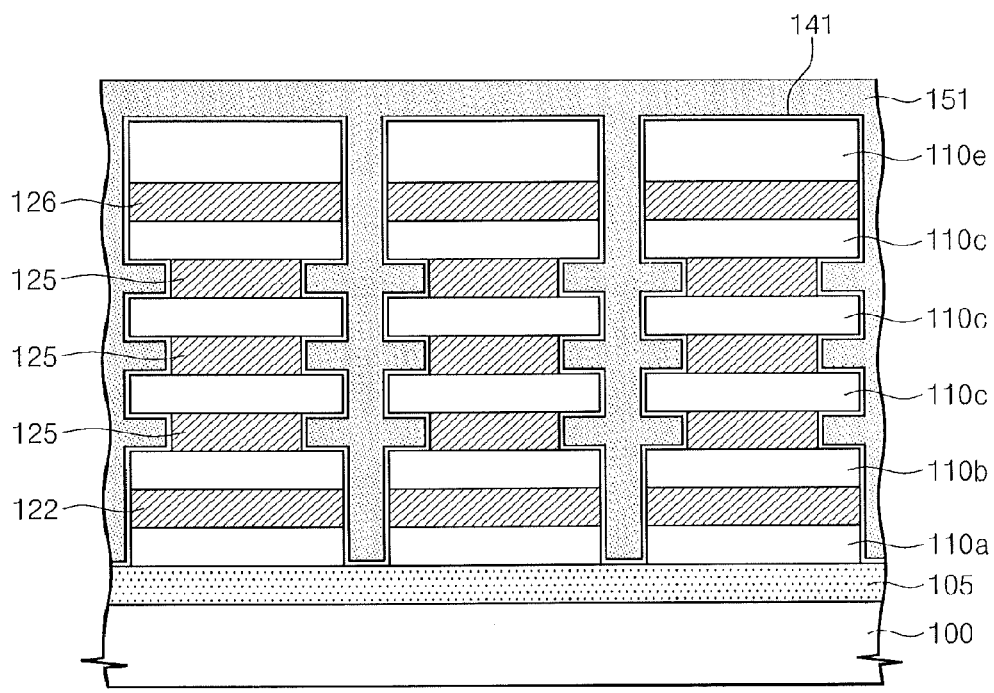
Figure 28:
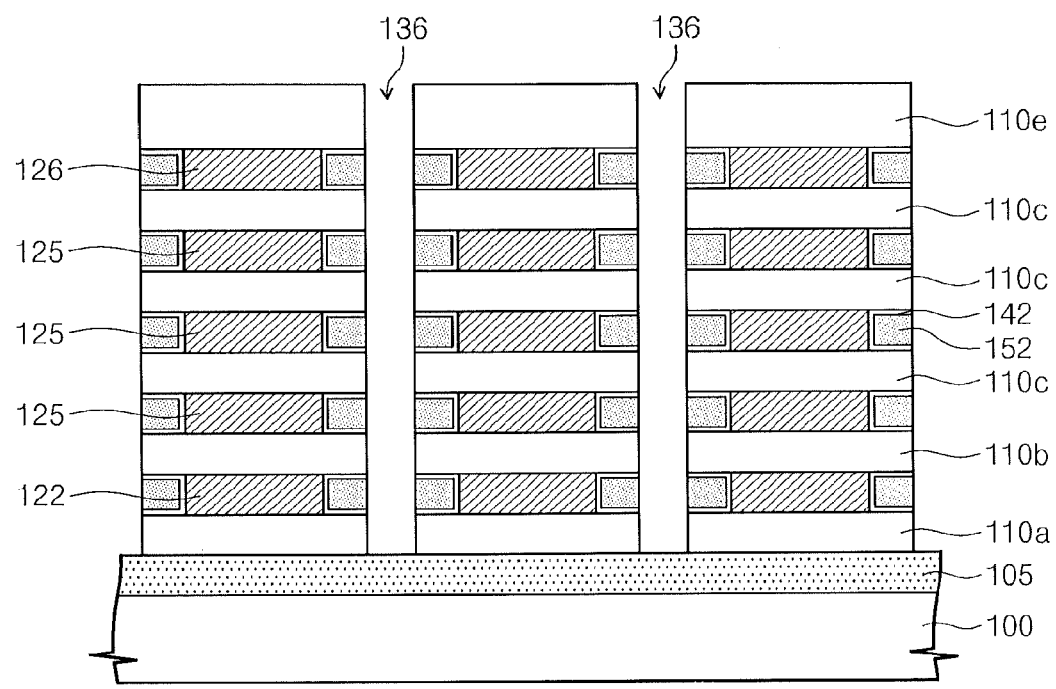

Referring to FIGS. 27 and 28, a buried conductive layer 151 may be formed to fill the inside of the first openings 135. The buried conductive layer 151 may fill the expansions 133. The buried conductive layer 151 may be formed of a conductive polysilicon.

Second openings 136 may be formed by performing the anisotropic etching with respect to the buried conductive layer 151. The anisotropic etching may be performed using the upper interlayer insulating layers 110*e* as an etching mask. The anisotropic etching may be performed to expose the upper surface of the substrate 100. Consequently, since a part of the buried conductive layer 151 remains in the expansions 133, buried conductive patterns 152 may be formed to serve as a floating gate. In addition, since the first insulating layer 141 formed on the inner walls of the first openings 135, except for the expansions 133, is selectively removed by the anisotropic etching, a first insulating pattern 142 serving as an interlayer insulating layer may be formed in the expansions 133. Accordingly, the interlayer insulating layers 110, the buried conductive patterns 152 serving as a floating gate, the upper conductive layer 126, and the lower conductive layer 122 may be exposed to the inner walls of the second openings 136. At this time, the first insulating pattern 142 may surround other surfaces of the buried conductive patterns 152 except for the side exposed to the inner walls of the second openings 136.

Alternatively, the first insulating patterns 142, which surround different floating gates, may be connected to each other along the inner walls of the second openings 136.

Referring back to FIG. 6, the gate insulating layer 143 may selectively be formed on the upper conductive layer 126, the buried conductive patterns 152, and the lower conductive layer 122 exposed to the inner walls of the second openings 136 by performing the oxidation process and the anisotropic etching with respect to the resulting structure of FIG. 28. Alternatively, the gate insulating layer 143 may extend along the inner walls of the second openings 136 by the deposition and anisotropic etching.

The second openings 136 may be filled with semiconductor materials, and then the semiconductor pillars PLs may be formed in the second openings 136. The semiconductor materials may include polycrystalline or single crystalline semiconductor.

The bit lines BLs may be formed on the semiconductor pillars PLs.

Figure 29:
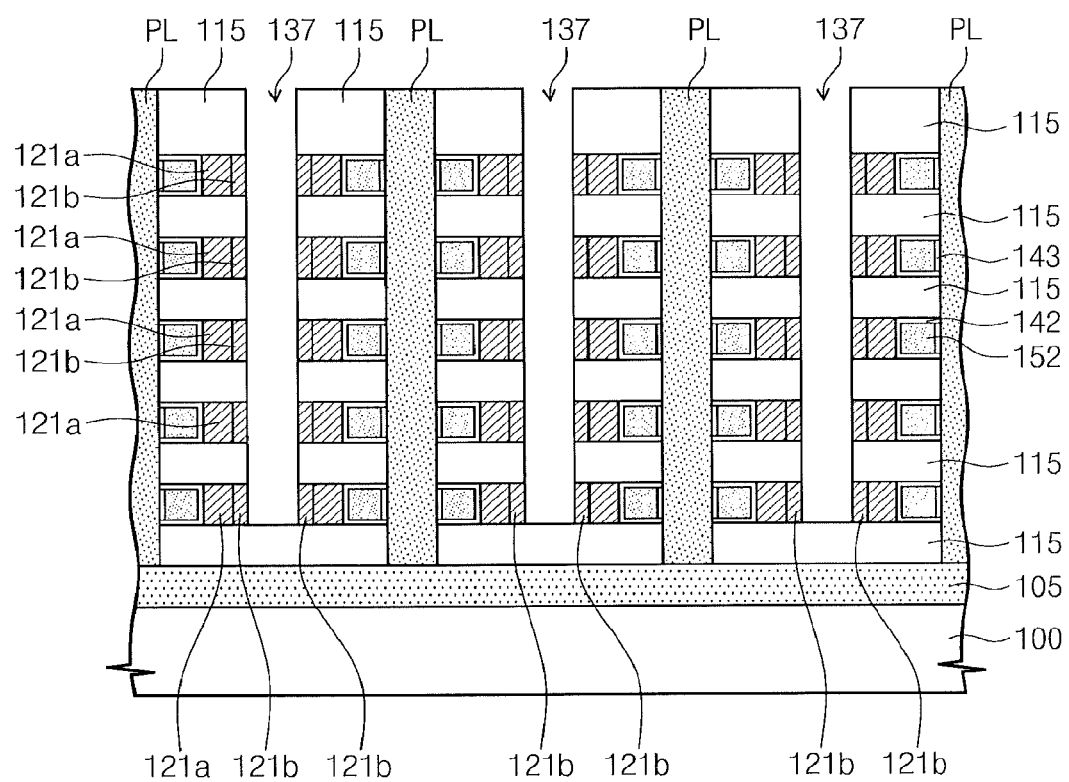
FIG. 29 is a cross-sectional view illustrating methods of fabricating a nonvolatile memory device according to still further embodiments of the inventive concept.

FIG. 29 illustrates methods of fabricating a three-dimensional nonvolatile memory device according to fourth embodiments of the inventive concept. With respect to the methods of fabricating the three-dimensional nonvolatile memory device according to the first to third embodiments of the inventive concept, same or similar components will be omitted or briefly described.

Referring to FIG. 29, the anisotropic etching may be performed to isolate the conductive patterns 121 stacked between the semiconductor pillars PLs of the resulting structure of FIG. 16. By the anisotropic etching, line openings 137 may be formed to penetrate the stacked interlayer insulating layers 110 and conductive patterns 121, and isolated conductive patterns 121*a* may be formed. Moreover, interlayer insulating patterns 115 may be formed by patterning the interlayer insulating layers 110.

Subsequently, silicide layers 121*b* may be formed on the surfaces of the isolated conductive patterns 121*a* exposed to the inner walls of the line openings 137 by a silicidation process. At this time, the upper surface of the semiconductor pillars PLs can be protected by an insulating layer (not illustrated). The silicidation process may include metal layer deposition, heat treatment, and unreacted metal removal.

Subsequently, the line openings 137 may be buried with insulating materials, and the bit lines BLs may be formed on the semiconductor pillars PLs to electrically connect with the semiconductor pillars PLs.

The processes may be applicable to the method of fabricating the memory devices according to the above-described embodiments of the inventive concept.

Figure 30:
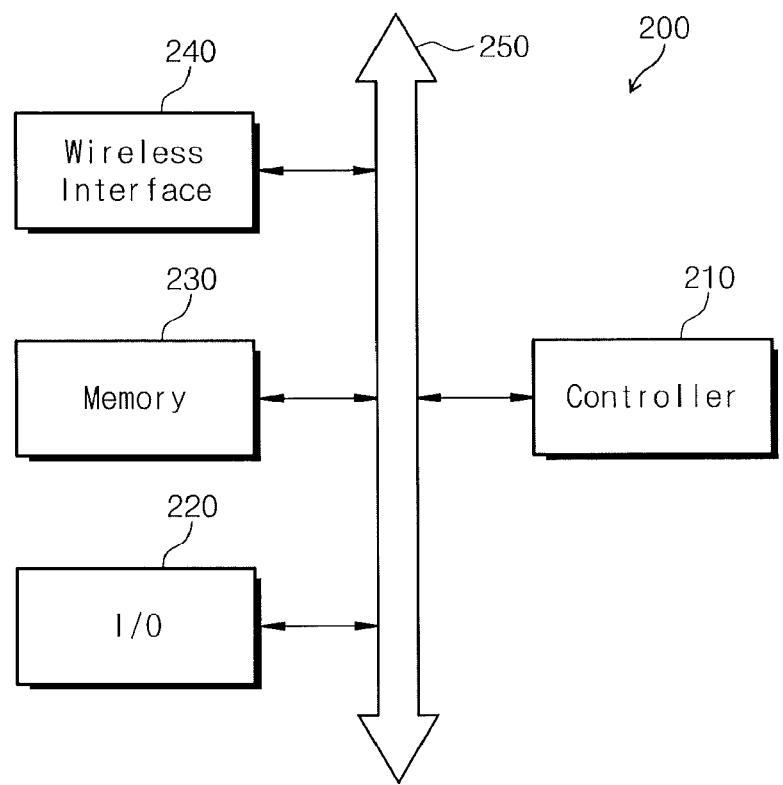
FIG. 30 is a block diagram illustrating schematically an electronic device including nonvolatile memory devices according to various embodiments of the inventive concept.

FIG. 30 illustrates an electronic device 200 including one or more nonvolatile memory devices according to various embodiments of the inventive concept. The electronic device 200 may be used in a wireless communication device such as PDA, a laptop computer, a mobile computer, a web tablet, a wireless phone, a cell phone, a digital music player and/or in all devices that can transmit and receive data in a wired and/or wireless environment.

The electronic device 200 may include a controller 210, an input/output device 220 such as, a keypad, a keyboard, or a display, a memory 230, and a wireless interface 240, which are combined to each other through a bus 250. The controller 210 may include at least one microprocessor, digital signal processor, microcontroller or the like. The memory 230 may be used to store instructions to be executed by the controller 210. Moreover, the memory 230 may be used to store a user data. The memory 230 includes a nonvolatile memory device according to various embodiments of the inventive concept.

The electronic device 200 may use a wireless interface 240 to transmit data to a wireless communication network communicating using a RF signal or to receive data from network. The wireless interface 240 may include an antenna, a wireless transceiver and so on.

The electronic system 200 may be used in a communication interface protocol of a third generation communication system such as CDMA, GSM, NADC, E-TDMA, WCDMA, and CDMA2000.

Figure 31:
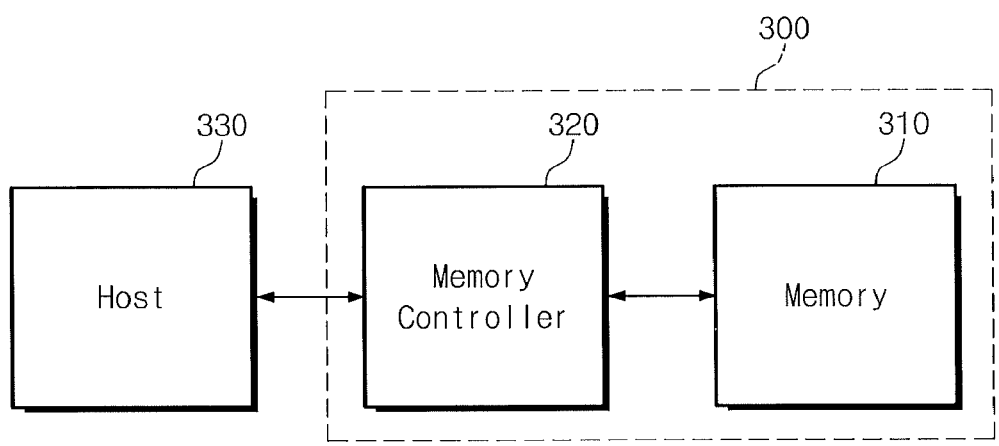
FIG. 31 is a block diagram illustrating a memory system including nonvolatile memory devices according to various embodiments of the inventive concept.

FIG. 31 illustrates a memory system including a nonvolatile memory device according to various embodiments of the inventive concept.

The memory system 300 may include a memory device 310 for storing mass data and a memory controller 320. The memory controller 320 controls the memory device 310 so as to read data stored in the memory device 310 and/or to write data into the memory device 310 in response to read/write requests of a host 330. The memory controller 320 may constitute an address mapping table for mapping an address provided from the host 330 (a mobile device or a computer system) into a physical address of the memory device 310. The memory 310 includes one or more nonvolatile memory devices according to various embodiments of the inventive concept.

Embodiments of the inventive concept may include a three-dimensional nonvolatile memory device with the floating gates. According to various embodiments of the inventive concept, since the floating gates are stacked to be isolated from each other, it can prevent charges stored in the floating gates from being diffused into another cell after the floating gates are programmed.

Accordingly, the reliability of semiconductor devices can be improved, and the malfunction of memory devices can be reduced or prevented.

In addition, since the floating gates are formed using the etch selectivity between different layers, it can be formed by a simple operation.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A monolithic three dimensional NAND string, comprising:
   a semiconductor channel;
   a plurality of control gate electrodes, wherein the plurality of control gate electrodes comprises a first control gate electrode located in a first device level and a second control gate electrode located in a second device level located over a major surface of a substrate and below the first device level;
   a blocking dielectric, the blocking dielectric comprising a plurality of blocking dielectric segments, wherein each of the plurality of blocking dielectric segments is located in contact with a respective one of the plurality of control gate electrodes, and wherein each of the plurality of blocking dielectric segments comprises a clam shape comprising an opening that faces a direction that is parallel to the major surface of the substrate; and
   a plurality of discrete charge storage segments, wherein each of the plurality of discrete charge storage segments is located at least partially in a respective blocking dielectric segment having the clam shape, and wherein the plurality of discrete charge storage segments comprises a first discrete charge storage segment located in the first device level and a second discrete charge storage segment located in the second device level.

2. The monolithic three dimensional NAND string of claim 1, wherein:
   the semiconductor channel comprises an end portion extending perpendicular to the major surface of the substrate;
   the plurality of control gate electrodes have a strip shape extending parallel to the major surface of the substrate; and
   the plurality of discrete charge storage segments comprise a plurality of floating gates.

3. The monolithic three dimensional NAND string of claim 1, wherein:
   the semiconductor channel has a pillar shape; and
   an entirety of the semiconductor channel having the pillar shape extends perpendicular to the major surface of the substrate.

4. The monolithic three dimensional NAND string of claim 3, further comprising one of a source or drain electrode which contacts the semiconductor channel having the pillar shape from above, and another one of a source or drain electrode which contacts the semiconductor channel having the pillar shape from below.

5. The monolithic three dimensional NAND string of claim 1, further comprising an insulating layer located between each one of the plurality of the discrete charge storage segments and the semiconductor channel, wherein the insulating layer does not extend inside the opening of the clam shape.

6. A monolithic three dimensional NAND string, comprising:
   a semiconductor channel;
   a plurality of control gate electrodes, wherein the plurality of control gate electrodes comprises a first control gate electrode located in a first device level and a second control gate electrode located in a second device level located over a major surface of a substrate and below the first device level;
   a blocking dielectric, the blocking dielectric comprising a plurality of blocking dielectric segments, wherein each of the plurality of blocking dielectric segments is located in contact with a respective one of the plurality of control gate electrodes; and
   a plurality of discrete charge storage segments, wherein at least one of the discrete charge storage segments is disposed in a recess adjacent to a side of the first control gate electrode,
   wherein the plurality of discrete charge storage segments comprises a first discrete charge storage segment located in the first device level and a second discrete charge storage segment located in the second device level, wherein a respective one of the plurality of blocking dielectric segments is on a plurality of sides of the first discrete charge storage segment and is on only one side of the first control gate electrode when viewed in a cross-sectional view, and wherein the respective one of the plurality of blocking dielectric segments comprises a first portion, and second and third portions that extend from the first portion in a direction parallel to the major surface of the substrate, when viewed in the cross-sectional view.

7. The monolithic three dimensional NAND string of claim 6, wherein the blocking dielectric is disposed between the first control gate electrode and the at least one of the discrete charge storage segments.

8. The monolithic three dimensional NAND string of claim 6, wherein the plurality of blocking dielectric segments comprise respective clam-shaped blocking dielectric segments.

9. The monolithic three dimensional NAND string of claim 6, wherein:
the semiconductor channel comprises an end portion extending perpendicular to the major surface of the substrate;
the plurality of control gate electrodes have a strip shape extending parallel to the major surface of the substrate; and
the plurality of discrete charge storage segments comprise a plurality of floating gates.

10. The monolithic three dimensional NAND string of claim 6, wherein:
the semiconductor channel comprises a pillar-shaped semiconductor channel; and
an entirety of the pillar-shaped semiconductor channel extends perpendicular to the major surface of the substrate.

11. The monolithic three dimensional NAND string of claim 10, further comprising one of a source or drain electrode which contacts the pillar-shaped semiconductor channel from above, and another one of a source or drain electrode which contacts the pillar-shaped semiconductor channel from below.

12. The monolithic three dimensional NAND string of claim 8, further comprising an insulating layer located between each one of the plurality of the discrete charge storage segments and the semiconductor channel, wherein the insulating layer does not extend inside respective openings in the clam-shaped blocking dielectric segments.

13. The monolithic three dimensional NAND string of claim 6, wherein the at least one of the discrete charge storage segments is adjacent to a side of a first insulating layer and a side of a second insulating layer, the first insulating layer disposed above the first control gate electrode and the second insulating layer disposed below the first control gate electrode.

14. The monolithic three dimensional NAND string of claim 6, further comprising an insulating layer located between each one of the plurality of the discrete charge storage segments and the semiconductor channel, wherein the insulating layer extends continuously along the semiconductor channel to contact each of the first and second discrete charge storage segments.

15. The monolithic three dimensional NAND string of claim 6, wherein the semiconductor channel extends continuously adjacent to the first and second discrete charge storage segments.

16. The monolithic three dimensional NAND string of claim 6, wherein the respective one of the plurality of blocking dielectric segments is on three sides of the first discrete charge storage segment.

17. The monolithic three dimensional NAND string of claim 1, wherein the clam shape comprises first and second portions that extend in the direction that is parallel to the major surface of the substrate.

18. The monolithic three dimensional NAND string of claim 1, wherein a first width of the clam shape in a direction perpendicular to the major surface of the substrate is equal to a second width of the first control gate electrode in the direction perpendicular to the major surface of the substrate.

19. The monolithic three dimensional NAND string of claim 1, wherein each of the plurality of blocking dielectric segments comprises a plurality of dielectric layers between its respective discrete charge storage segment and its respective control gate electrode.

* * * * *